United States Patent
Hwang et al.

(10) Patent No.: US 9,583,034 B2
(45) Date of Patent: Feb. 28, 2017

(54) SUBPIXEL ARRANGEMENT STRUCTURE FOR DISPLAY DEVICE

(75) Inventors: Soonjae Hwang, Gumi-si (KR); Homin Lim, Paju-si (KR); Hanareum Jung, Daegu-si (KR); Thomas Lloyd Credelle, Morgan Hill, CA (US)

(73) Assignee: LG Display Co., Ltd., Seoul (KR)

( * ) Notice: Subject to any disclaimer, the term of this patent is extended or adjusted under 35 U.S.C. 154(b) by 1013 days.

(21) Appl. No.: 13/192,230

(22) Filed: Jul. 27, 2011

(65) Prior Publication Data

US 2012/0092238 A1    Apr. 19, 2012

(30) Foreign Application Priority Data

Oct. 15, 2010 (KR) .................. 10-2010-0101085

(51) Int. Cl.
*G09G 3/3208* (2016.01)
*G09G 3/20* (2006.01)
*G09G 3/32* (2016.01)

(52) U.S. Cl.
CPC ............ *G09G 3/20* (2013.01); *G09G 3/3208* (2013.01); *G09G 2300/0452* (2013.01); *G09G 2300/0465* (2013.01)

(58) Field of Classification Search
CPC .... G09G 3/2074; G09G 3/3607; G09G 3/364; G09G 2300/0439; G09G 2300/0443; G09G 2300/0452; G09G 2300/0465
USPC .................. 345/55, 694, 695, 698
See application file for complete search history.

(56) References Cited

U.S. PATENT DOCUMENTS

| | | | |
|---|---|---|---|
| 2005/0270444 A1* | 12/2005 | Miller et al. ................ | 349/108 |
| 2008/0001525 A1* | 1/2008 | Chao et al. ................. | 313/500 |
| 2010/0118045 A1* | 5/2010 | Brown Elliott et al. ..... | 345/589 |

* cited by examiner

*Primary Examiner* — Seokyun Moon
(74) *Attorney, Agent, or Firm* — Birch, Stewart, Kolasch & Birch, LLP

(57) ABSTRACT

A subpixel arrangement structure for a display device includes a plurality of unit pixels each having a red subpixel, a green subpixel, and a blue subpixel. The red, green, and blue subpixels form a delta arrangement. Green subpixels are disposed on a plurality of first subpixel arrangement lines, each of which extends along a direction of a first axis. Two red subpixels and two blue subpixels are alternately disposed along the first axis direction on a plurality of second subpixel arrangement lines. Each of the plurality of second subpixel arrangement lines is positioned between every two of the plurality of first subpixel arrangement lines and extends along the first axis direction.

18 Claims, 16 Drawing Sheets

US 9,583,034 B2

SUBPIXEL ARRANGEMENT STRUCTURE FOR DISPLAY DEVICE

CROSS-REFERENCE TO RELATED APPLICATION

This application claims priority to and the benefit of Korean Patent Application No. 10-2010-0101085 filed in the Korean Intellectual Property Office on Oct. 15, 2010, the entire contents of which are incorporated herein by reference.

BACKGROUND OF THE INVENTION

Field of the Invention

Embodiments of the invention relate to a subpixel arrangement structure for a display device.

Discussion of the Related Art

Examples of a display device for implementing an image include a cathode ray tube (CRT), a liquid crystal display (LCD), an organic light emitting diode (OLED) display, and a plasma display panel (PDP).

An active matrix type organic light emitting diode (AMOLED) display includes an organic light emitting diode (OLED) element having a self-emitting structure, and thus has advantages such as a fast response time, excellent light emitting efficiency, a high luminance, and a wide viewing angle. The AMOLED display controls a current flowing in an OLED (or the OLED element) using thin film transistors (TFTs) to thereby display an image.

The AMOLED display generally includes a plurality of red, green, and blue subpixels, so as to achieve a full color display. A RGB stripe structure illustrated in FIG. 1 is known as an arrangement structure of the subpixels of the AMOLED display.

As shown in FIG. 1, each of pixels formed on a display panel 10 includes a red subpixel SPR, a green subpixel SPG, and a blue subpixel SPB, which are positioned adjacent to one another in a horizontal direction. The red, green, and blue subpixels SPR, SPG, and SPB are arranged in a stripe form and are partitioned by a black region 11. OLEDs of the red, green, and blue subpixels SPR, SPG, and SPB have a red light emitting layer, a green light emitting layer, and a blue light emitting layer, respectively. The red, green, and blue light emitting layers of the red, green, and blue subpixels SPR, SPG, and SPB are separately deposited through a fine metal mask (FMM) method using a shadow mask.

The FMM method requires a process margin of a predetermined distance between the adjacent red, green, and blue subpixels SPR, SPG and SPB. As a resolution of the display panel 10 increases, a distance between the subpixels decreases. Therefore, opening areas of the subpixels has to decrease so as to secure the process margin. However, when the opening areas decreases, an aperture ratio and a luminance of the display panel 10 are entirely reduced. Accordingly, because the display panel 10 having the RGB stripe structure has a high resolution limit, a new arrangement structure of subpixels has been demanded.

SUMMARY OF THE INVENTION

Embodiments of the invention provide a subpixel arrangement structure for a display device capable of increasing an aperture ratio and a luminance at a high resolution.

Embodiments of the invention also provide a subpixel arrangement structure for a display device capable of preventing a reduction in display quality while increasing an aperture ratio and a luminance.

In one aspect there is a subpixel arrangement structure for a display device including a plurality of unit pixels each having a red subpixel, a green subpixel, and a blue subpixel, the red, green, and blue subpixels forming a delta arrangement, wherein green subpixels are disposed on a plurality of first subpixel arrangement lines, each of which extends along a direction of a first axis, and two red subpixels and two blue subpixels are alternately disposed along the first axis direction on a plurality of second subpixel arrangement lines, each of the plurality of second subpixel arrangement lines being positioned between every two of the plurality of first subpixel arrangement lines and extending along the first axis direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the invention, examples of which are illustrated in the accompanying drawings.

Figure 1:
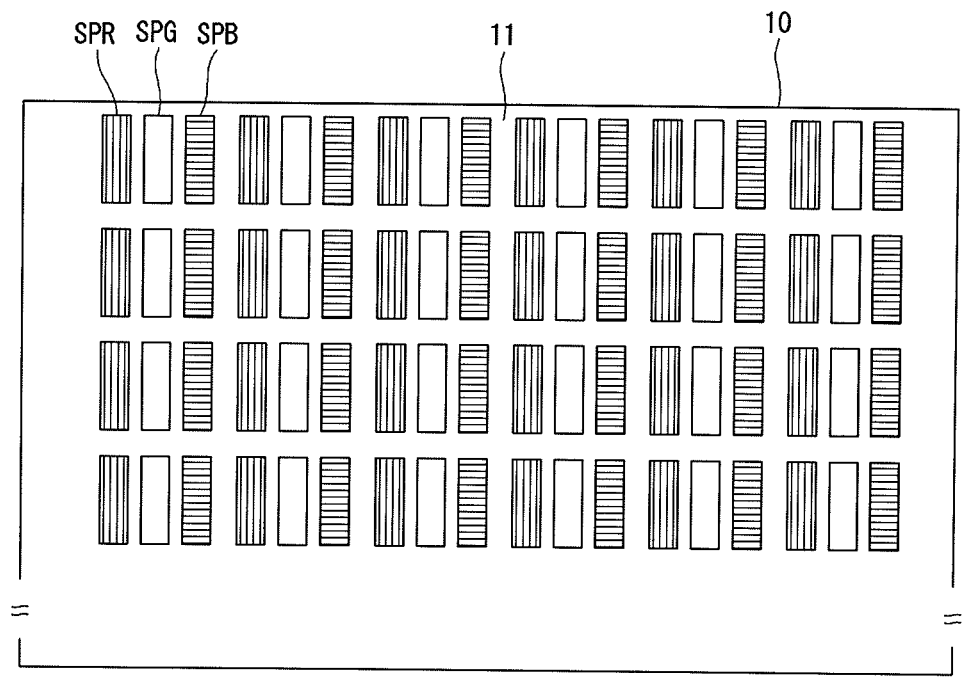
FIG. 1 illustrates a related art RGB stripe arrangement structure of subpixels.
Figure 2:
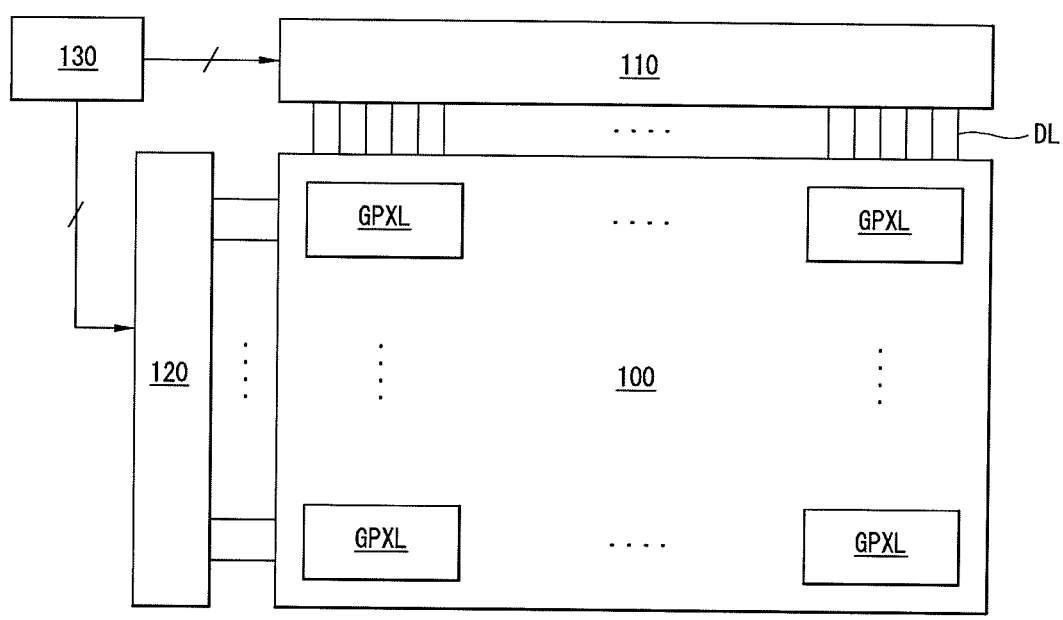
FIG. 2 schematically illustrates a display device according to an example embodiment of the invention.

FIG. 2 schematically illustrates a display device according to an example embodiment of the invention.

As shown in FIG. 2, a display device according to an example embodiment of the invention includes a display panel 100, a data driving circuit 110, a gate driving circuit 120, and a timing controller 130.

The display panel 100 may be implemented as an organic light emitting diode (OLED) panel. Additionally, the display panel 100 applicable to the example embodiment of the invention may be implemented as a liquid crystal display panel, a plasma display panel, and an electrophoresis display panel.

The display panel 100 includes a plurality of pixel groups GPXL. Each pixel group GPXL includes four unit pixels (=two unit pixels×two unit pixels). Each of first to fourth unit pixels constituting one pixel group GPXL includes three subpixels (i.e., red, green, and blue subpixels) having a delta arrangement structure, so as to have an increase or improved aperture ratio.

Each pixel group GPXL includes 12 subpixels, and one unit pixel includes three subpixels (i.e., red, green, and blue subpixels) having the delta arrangement structure. In other words, red, green, and blue subpixels of each pixel group GPXL constitute four unit pixels each having the delta arrangement structure. A plurality of data lines DL (for example, 6 data lines) and a plurality of gate lines GL (for example, 2 gate lines) may be assigned to each pixel group GPXL.

The red subpixel includes a red organic light emitting diode (OLED) having a red light emitting layer, the green subpixel includes a green OLED having a green light emitting layer, and the blue subpixel includes a blue OLED having a blue light emitting layer. The OLED further includes a first electrode (for example, a cathode electrode) stacked on the light emitting layer and a second electrode (for example, an anode electrode) stacked under the light emitting layer. The OLED may emit light in a top emission type fashion. The light emitting layer emits light by a driving current applied from a thin film transistor (TFT) array via the second electrode.

The red, green, and blue subpixels may be arranged along a direction of a first axis. Additionally, the green subpixels may be arranged along a direction of a second axis perpendicular to the first axis, and the red and blue subpixels may be arranged in zigzags along the direction of the second axis. The arrangement structure of the red, green, and blue subpixels indicates an arrangement structure of openings of the red, green, and blue subpixels. The opening indicates a display area of an image displayed on the subpixel by light produced in the light emitting layer. In the following description, the term of "opening" is omitted in the arrangement structure of the subpixels for the sake of brevity.

The data driving circuit 110 includes a plurality of source driver integrated circuits (ICs) and drives the data lines DL of the display panel 100. The data driving circuit 110 converts input digital video data into a data voltage under the control of the timing controller 130 and supplies the data voltage to the data lines DL. The data voltage is applied to the TFT array through the data lines DL and determines a driving current, which is supplied from a driving element to the second electrode.

The gate driving circuit 120 includes at least one gate driver IC and sequentially supplies a scan pulse (or a gate pulse) to the gate lines GL of the display panel 100. In a gate in panel (GIP) manner, the gate driving circuit 120 may include a shift register formed on the display panel 100.

The timing controller 130 receives a plurality of timing signals from an external system and generates control signals for controlling operation timings of the data driving circuit 110 and the gate driving circuit 120. The timing controller 130 receives the digital video data from the external system and supplies the digital video data to the data driving circuit 110.

Figure 3:
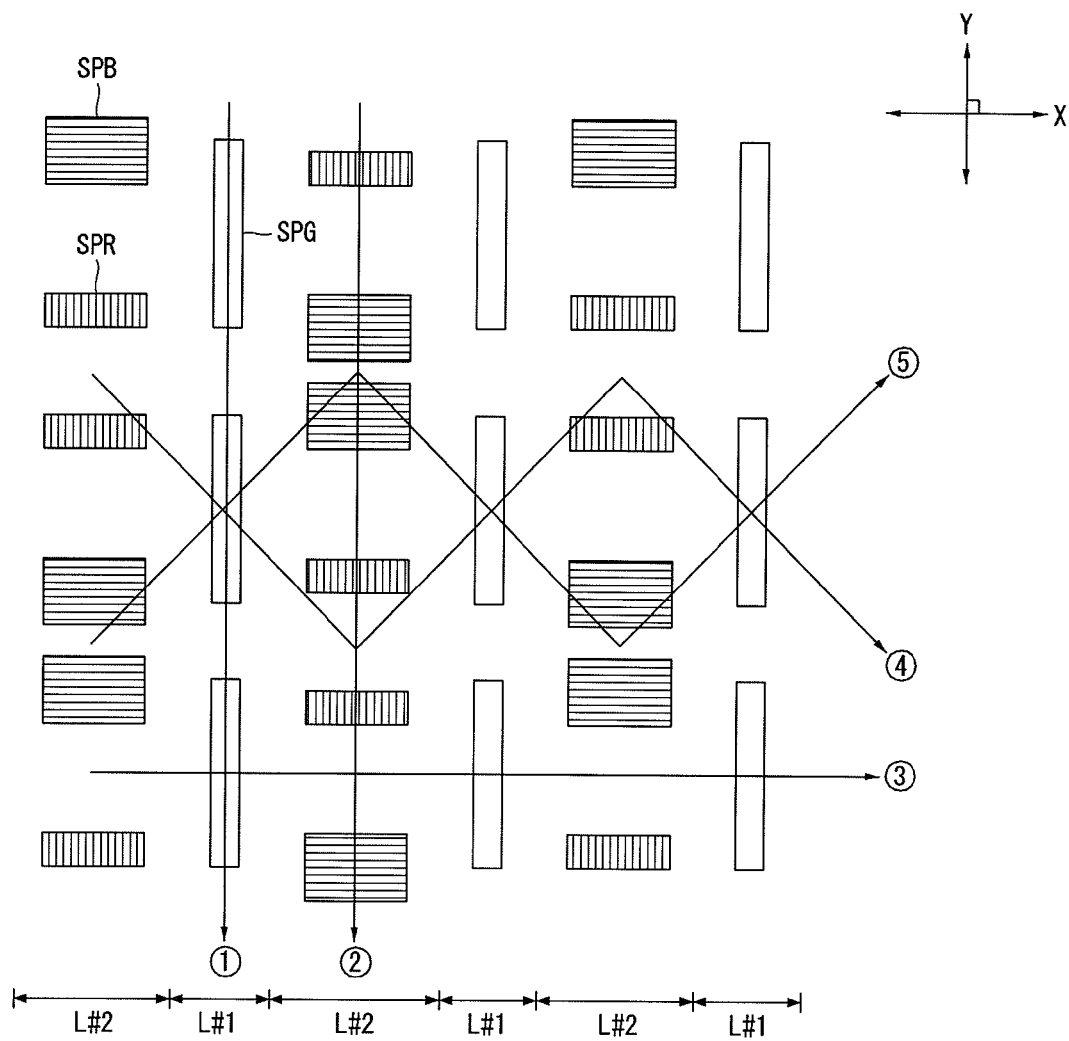
FIG. 3 illustrates a first subpixel arrangement structure for a display device according to an example embodiment of the invention.

FIG. 3 illustrates a first subpixel arrangement structure for the display device according to the example embodiment of the invention.

As shown in FIG. 3, in the first subpixel arrangement structure for the display device, green subpixels SPG are disposed on each of first subpixel arrangement lines L#1 extending along a direction of a first axis (hereinafter, referred to as Y-axis). Further, two red subpixels SPR and two blue subpixels SPB are alternately disposed along the Y-axis direction on second subpixel arrangement lines L#2, each of which is positioned between the every two first subpixel arrangement lines L#1 and extends along the Y-axis direction.

More specifically, the green subpixels SPG are aligned on each first subpixel arrangement line L#1 along the Y-axis direction as indicated by ① of FIG. 3. A long axis of the green subpixel SPG having a rectangular shape is parallel to the Y-axis. The two red subpixels SPR and the two blue subpixels SPB are alternately aligned on each second subpixel arrangement line L#2 along the Y-axis direction as indicated by ② of FIG. 3. Long axes of the red and blue subpixels SPR and SPB each having a rectangular shape are parallel to a second axis (hereinafter, referred to as X-axis) perpendicular to the first axis. The two red subpixels SPR, which are positioned adjacent to each other in the Y-axis direction, form a pair, and the two blue subpixels SPB, which are positioned adjacent to each other in the Y-axis direction, form a pair.

Further, the green subpixels SPG are aligned along the X-axis direction as indicated by ③ of FIG. 3. A plurality of red subpixel pairs each including the two red subpixels SPR, which are positioned adjacent to each other in the Y-axis direction, are aligned in zigzags along the X-axis direction based on a first zigzag arrangement pattern as indicated by ④ of FIG. 3. A plurality of blue subpixel pairs each including the two blue subpixels SPB, which are positioned adjacent to each other in the Y-axis direction, are aligned in zigzags along the X-axis direction based on a second zigzag arrangement pattern as indicated by ⑤ of FIG. 3. The second zigzag arrangement pattern is reverse to the first zigzag arrangement pattern.

Figure 4:
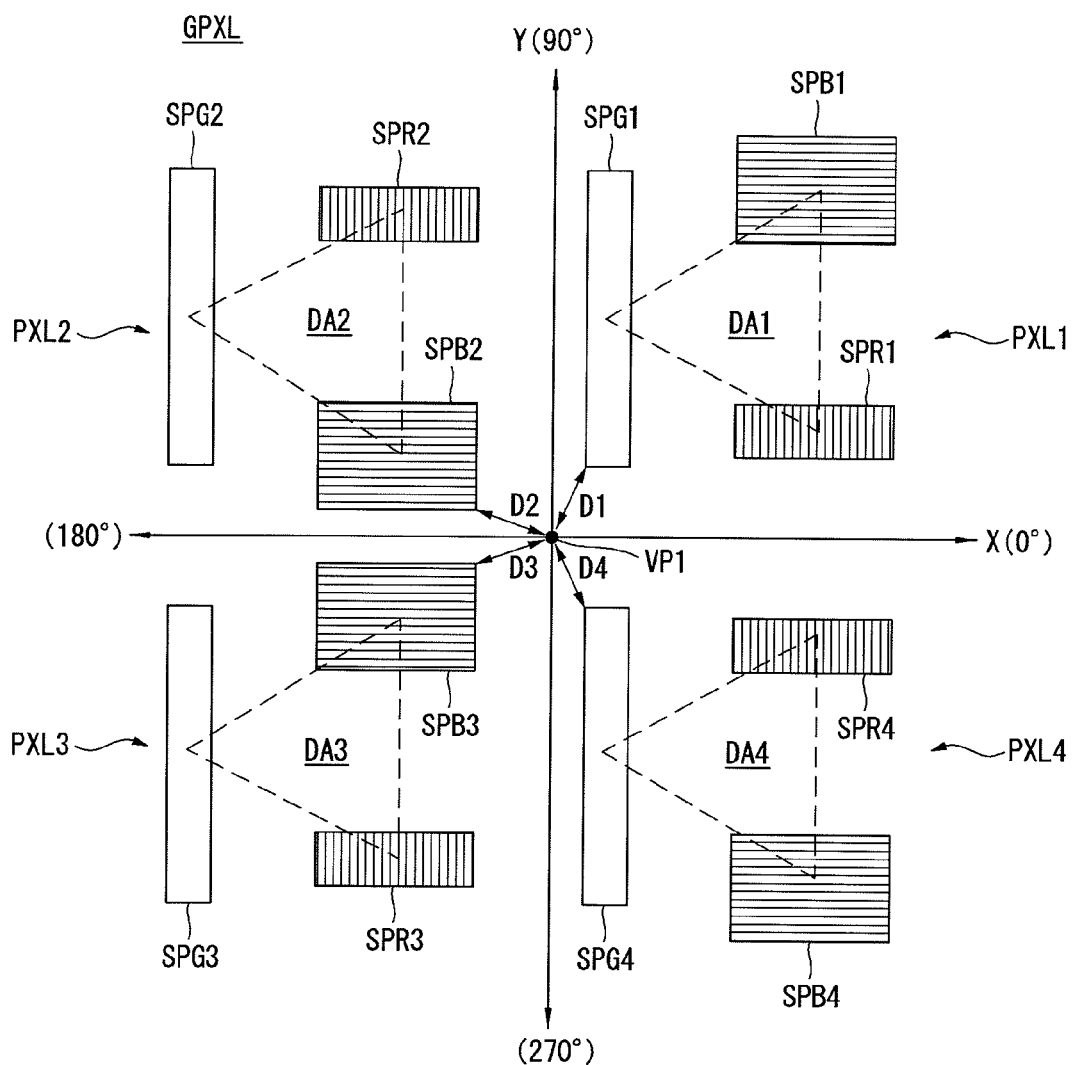
FIG. 4 illustrates a pixel group of the subpixel arrangement structure illustrated in FIG. 3.
Figure 4:
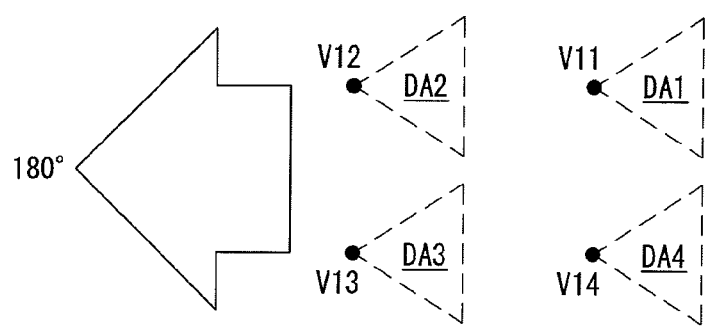
Figure 9:
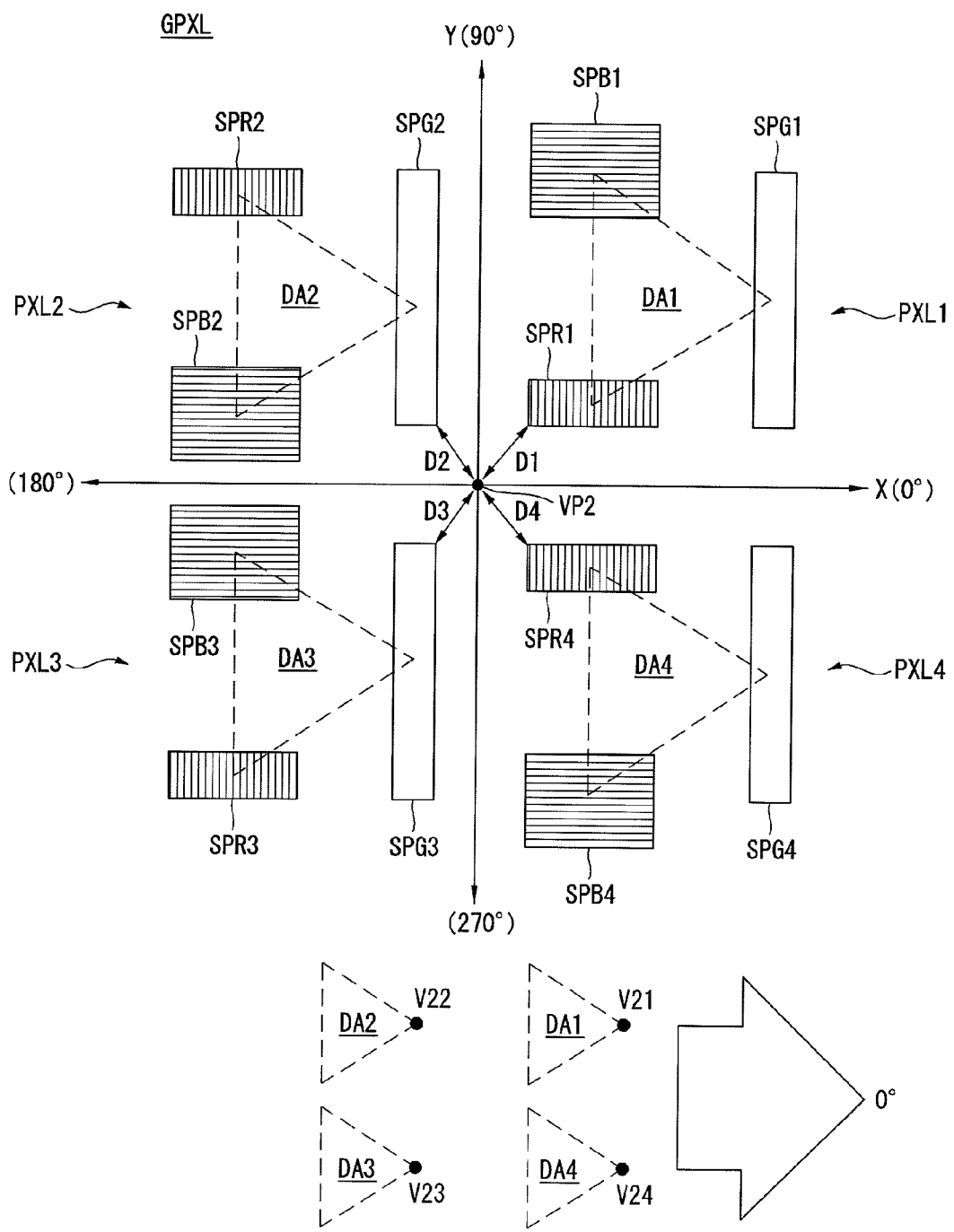
FIG. 9 illustrates another pixel group of the subpixel arrangement structure illustrated in FIG. 3.

In the above-described first subpixel arrangement structure for the display device, the adjacently disposed red, green, and blue subpixels SPR, SPG, and SPB form the delta arrangement structure to constitute one unit pixel. The display panel 100 has the subpixel arrangement structure in which the pixel group GPXL including four unit pixels is repeatedly disposed. The pixel group GPXL including the four unit pixels each having the delta arrangement structure may be configured as shown in FIG. 4 or as shown in FIG. 9. In the embodiments of the invention as shown in FIGS. 4 and 9, four unit pixels constitute a pixel group, and each pixel group includes a green subpixel disposed on one of the first subpixel arrangement lines, and a red subpixel and a blue subpixel disposed on one of the second subpixel arrangement lines.

FIG. 4 illustrates a pixel group of the subpixel arrangement structure illustrated in FIG. 3.

As shown in FIG. 4, a pixel group GPXL includes a first unit pixel PXL1 including subpixels having a first delta arrangement DA1, a second unit pixel PXL2 including subpixels having a second delta arrangement DA2, a third unit pixel PXL3 including subpixels having a third delta arrangement DA3, and a fourth unit pixel PXL4 including subpixels having a fourth delta arrangement DA4.

The first unit pixel PXL1 includes a first green subpixel SPG1 disposed on one (for example, a 1-1 subpixel arrangement line) of the first subpixel arrangement lines L#1, a first blue subpixel SPB1, that is partially opposite to an upper portion of a right long side of the first green subpixel SPG1, and a first red subpixel SPR1, that is disposed on the same subpixel arrangement line as the first blue subpixel SPB1 and is opposite to a lower portion of the right long side of the first green subpixel SPG1, thereby forming the first delta arrangement DA1. The first delta arrangement DA1 has a triangle structure obtained by connecting virtual central points (or virtual internal points) of the subpixels SPR1, SPG1, and SPB1 to one another.

The second unit pixel PXL2 includes a second green subpixel SPG2 disposed on a 1-2 subpixel arrangement line adjacent to the 1-1 subpixel arrangement line, a second red subpixel SPR2, that is opposite to an upper portion of a right long side of the second green subpixel SPG2, and a second blue subpixel SPB2, that is disposed on the same subpixel arrangement line as the second red subpixel SPR2 and is partially opposite to a lower portion of the right long side of the second green subpixel SPG2, thereby forming the second delta arrangement DA2. The second delta arrangement DA2 has a triangle structure obtained by connecting virtual central points (or virtual internal points) of the subpixels SPR2, SPG2, and SPB2 to one another.

The third unit pixel PXL3 includes a third green subpixel SPG3 disposed on the 1-2 subpixel arrangement line, a third blue subpixel SPB3, that is partially opposite to an upper portion of a right long side of the third green subpixel SPG3, and a third red subpixel SPR3, that is disposed on the same subpixel arrangement line as the third blue subpixel SPB3 and is opposite to a lower portion of the right long side of the third green subpixel SPG3, thereby forming the third delta arrangement DA3. The third delta arrangement DA3 has a triangle structure obtained by connecting virtual central points (or virtual internal points) of the subpixels SPR3, SPG3, and SPB3 to one another.

The fourth unit pixel PXL4 includes a fourth green subpixel SPG4 disposed on the 1-1 subpixel arrangement line, a fourth red subpixel SPR4, that is opposite to an upper portion of a right long side of the fourth green subpixel SPG4, and a fourth blue subpixel SPB4, that is disposed on the same subpixel arrangement line as the fourth red subpixel SPR4 and is partially opposite to a lower portion of the right long side of the fourth green subpixel SPG4, thereby forming the fourth delta arrangement DA4. The fourth delta arrangement DA4 has a triangle structure obtained by connecting virtual central points (or virtual internal points) of the subpixels SPR4, SPG4, and SPB4 to one another.

The first blue and red subpixels SPB1 and SPR1 and the fourth red and blue subpixels SPR4 and SPB4 are aligned on one (for example, a 2-1 subpixel arrangement line) of the second subpixel arrangement lines L#2. The second red and blue subpixels SPR2 and SPB2 and the third blue and red subpixels SPB3 and SPR3 are aligned on a 2-2 subpixel arrangement line adjacent to the 2-1 subpixel arrangement line.

Long axes of the red and blue subpixels SPR1-SPR4 and SPB1-SPB4 are perpendicular to long axes of the green subpixels SPG1-SPG4. Lengths of long sides of the red and blue subpixels SPR1-SPR4 and SPB1-SPB4 may be substantially equal to one another and may be shorter than lengths of the long sides of the green subpixels SPG1-SPG4. The size of the blue subpixels SPB1-SPB4 having a relatively small contribution to a luminance may be greater than the size of the red subpixels SPR1-SPR4 having a relatively large contribution to the luminance.

When the Y-axis and the X-axis cross each other on a virtual central point VP1 (or virtual internal point) of the pixel group GPXL to form the quadrants I, II, III, and IV, the first delta arrangement DA1 may be positioned in the quadrant I (i.e., 0° to 90°), the second delta arrangement DA2 may be positioned in the quadrant II (i.e., 90° to 180°), the third delta arrangement DA3 may be positioned in the quadrant III (i.e., 180° to 270°), and the fourth delta arrangement DA4 may be positioned in the quadrant IV (i.e., 270° to 0°). Thus, the respective delta arrangements DA1, DA2, DA3 and DA 4 may be positioned in respective quadrants I, II, III, and IV counterclockwise with respect to the virtual central point VP 1. Further, a shortest distance D1 between the first unit pixel PXL1 and the virtual central point VP1, a shortest distance D2 between the second unit pixel PXL2 and the virtual central point VP1, a shortest distance D3 between the third unit pixel PXL3 and the virtual central point VP1, and a shortest distance D4 between the fourth unit pixel PXL4 and the virtual central point VP1 may be substantially equal to one another.

A reason to arrange the subpixels of each of the first to fourth unit pixels PXL1-PXL4 in the delta structure is to increase the aperture ratio in the X-axis and Y-axis directions. The first and third delta arrangements DA1 and DA3 of the first and third unit pixels PXL1 and PXL3 are substantially the same as each other in a first diagonal direction, and the second and fourth delta arrangements DA2 and DA4 of the second and fourth unit pixels PXL2 and PXL4 are substantially the same as each other in a second diagonal direction. Thus, the first and third delta arrangements DA1 and DA3 of the first and third unit pixels PXL1 and PXL3 have translational symmetry in the first diagonal direction, and the second and fourth delta arrangements DA2 and DA4 of the second and fourth unit pixels PXL2 and PXL4 have translational symmetry in the second diagonal direction. In the pixel group GPXL, 1-1 to 1-4 vertices V11-V14 of the first through fourth delta arrangements respectively corresponding to the central points of the green subpixels SPG1-SPG4 are directed toward a direction of about 180° (e.g., toward the left of FIG. 4).

Figure 5A:
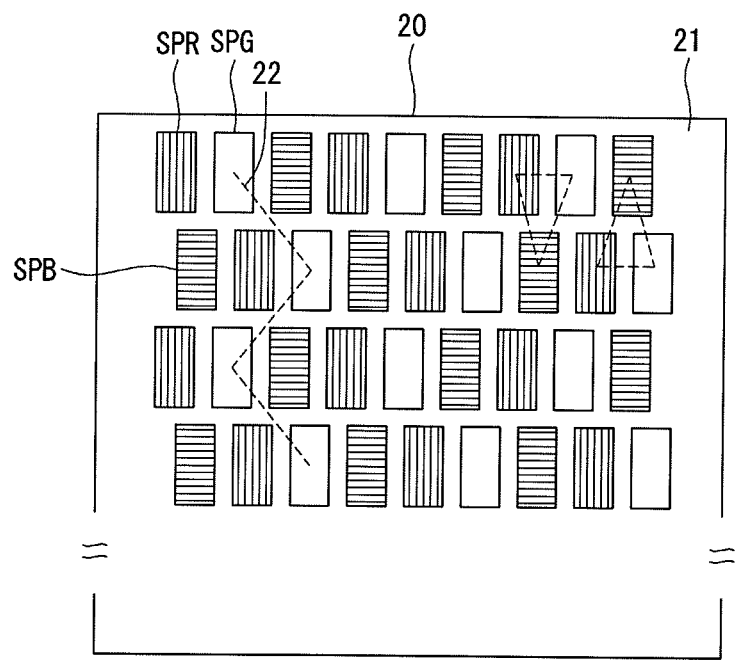
FIG. 5A illustrates an existing RGB delta type of subpixel arrangement structure.

An RGB delta structure shown in FIG. 5A is a method for increasing the aperture ratio in the X-axis direction. As shown in FIG. 5A, each of a plurality of unit pixels formed on a display panel 20 is disposed in a triangle shape and includes a red subpixel SPR, a green subpixel SPG, and a blue subpixel SPB, that are partitioned by a black region 21. This existing RGB delta structure is effective at increasing the aperture ratio. However, because the subpixels (for example, the green subpixels SPG) of the same color are disposed in zigzags along a column direction (i.e., the Y-axis direction), a straight line in the column direction when texts are displayed is displayed in a wavy shape 22. Such a jagging phenomenon reduces the display quality.

Figure 5B:
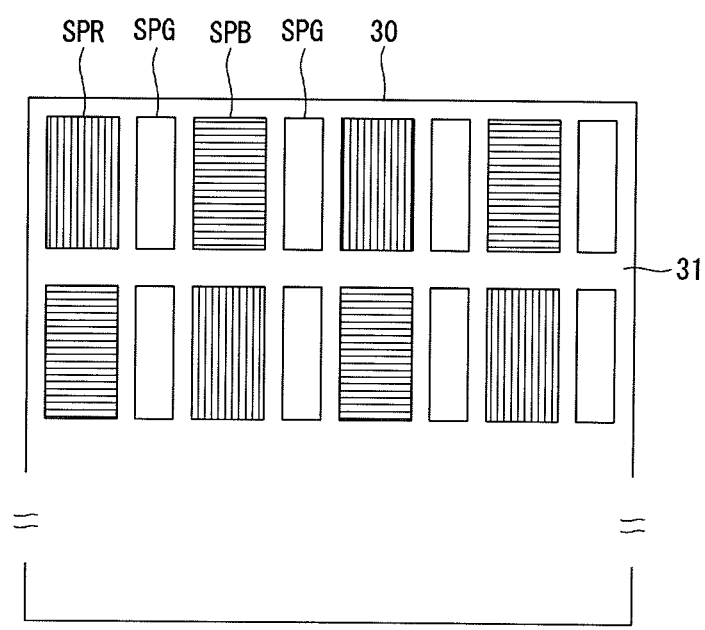
FIG. 5B illustrates an existing RGBG type of a subpixel arrangement structure.

An RGBG structure shown in FIG. 5B is another method for increasing the aperture ratio in the X-axis direction. As shown in FIG. 5B, each of a plurality of pixel groups formed on a display panel 30 includes four unit pixels. Each pixel group includes 8 subpixels, i.e., 4 green subpixels SPG; 2 red subpixels SPR, and 2 blue subpixels SPB, that are partitioned by a black region 21. This existing RGBG structure is effective at increasing the aperture ratio. However, because the pixel group including the four unit pixels includes only the 2 red subpixels SPR and only the 2 blue subpixels SPB, an image displayed on the display panel 30 is not clear. Hence, the image quality thereof is reduced.

The embodiment of the invention arranges the subpixels based on the subpixel arrangement structure illustrated in FIG. 3, so as to solve the problems of the existing subpixel structures shown in FIGS. 5A and 5B while increasing the aperture ratio through the delta arrangement of the subpixels.

In the embodiment of the invention, the green subpixels SPG are arranged in the Y-axis direction and also are arranged in the X-axis direction. The two red subpixels SPR and the two blue subpixels SPB are alternately arranged in the Y-axis direction. This vertical arrangement greatly improves the display quality, particularly, text readability and also increases the image quality.

In the embodiment of the invention, the plurality of red subpixel pairs each including the two red subpixels SPR and the plurality of blue subpixel pairs each including the two blue subpixels SPB are arranged in zigzags along the X-axis direction. Even if the red and blue subpixels SPR and SPB are disposed in zigzags along the X-axis direction, the red and blue subpixels SPR and SPB do not greatly affect the display quality because the red and blue subpixels SPR and SPB contribute to the luminance less than the green subpixel SPG. This zigzag structure provides convenience to a process for forming the light emitting layer using a fine metal mask (FMM) method.

Figure 6:
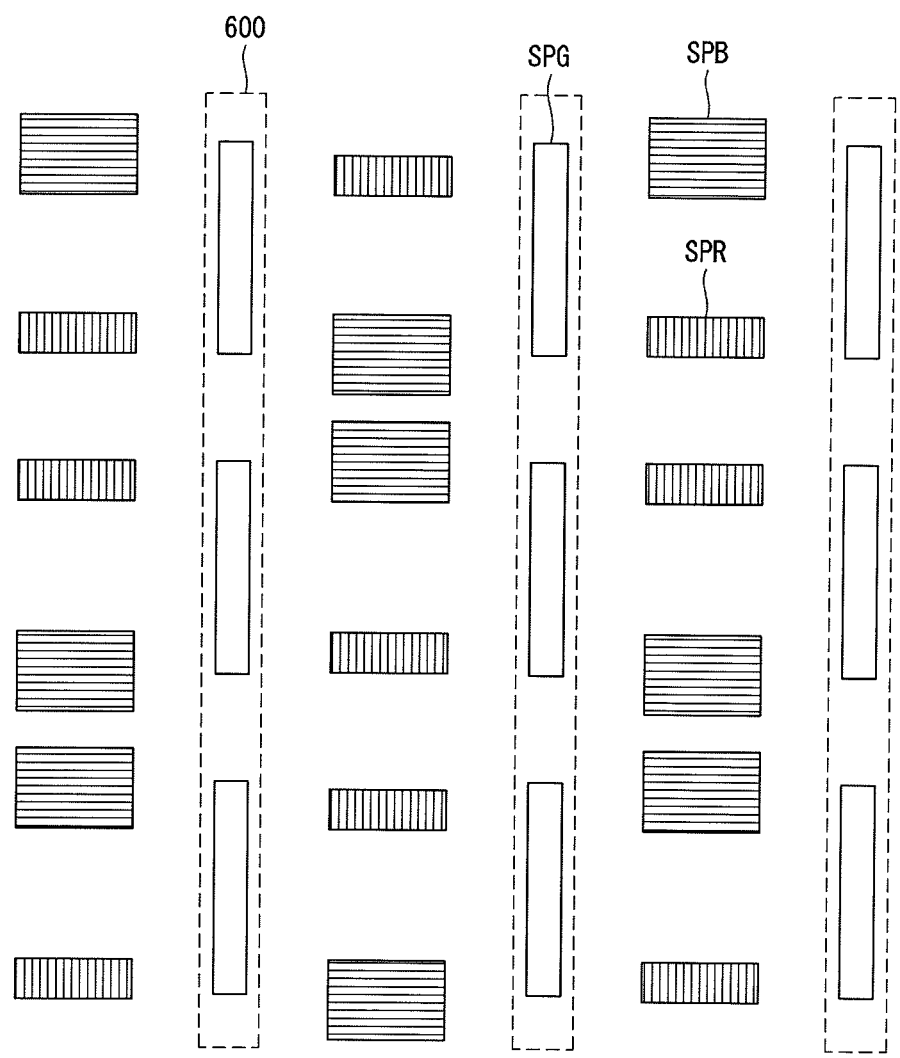
FIG. 6 illustrates openings of a shadow mask for forming a green light emitting layer using a fine metal mask (FMM) method in the subpixel arrangement structure illustrated in FIG. 3.

FIG. 6 illustrates openings 600 of a shadow mask aligned in the Y-axis direction for forming the green light emitting layers using the FMM method. The green light emitting layers on each first subpixel arrangement line L#1 (for example, each column line) may be simultaneously deposited through the openings 600 of the shadow mask. As a result, the green light emitting layers are deposited more easily than green light emitting layers of the green subpixels SPG shown in FIG. 5A. Further, because the green light emitting layers may be formed longer than the existing green light emitting layers in the Y-axis direction, the green light emitting layers may greatly contribute to an increase in the luminance.

Figure 7:
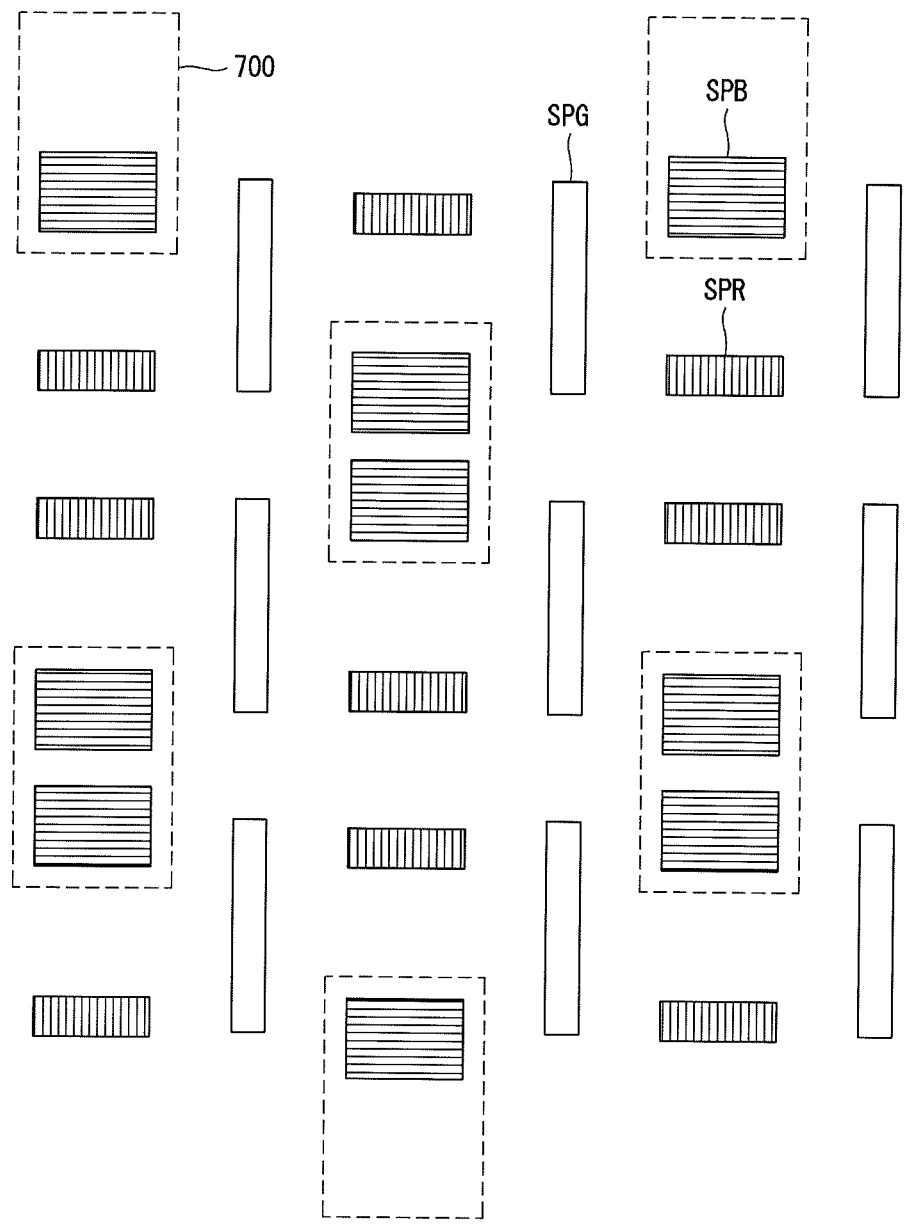
FIG. 7 illustrates openings of a shadow mask for forming a blue light emitting layer using a FMM method in the subpixel arrangement structure illustrated in FIG. 3.

FIG. 7 illustrates openings 700 of a shadow mask aligned in the Y-axis direction for forming the blue light emitting layers using the FMM method. The two blue light emitting layers may be simultaneously deposited through the openings 700 of the shadow mask. Because the openings 700 of the shadow mask are formed in zigzags along the X-axis direction based on the arrangement structure of the green or red subpixels SPG and SPR, the firmness of the shadow mask may be improved.

Figure 8:
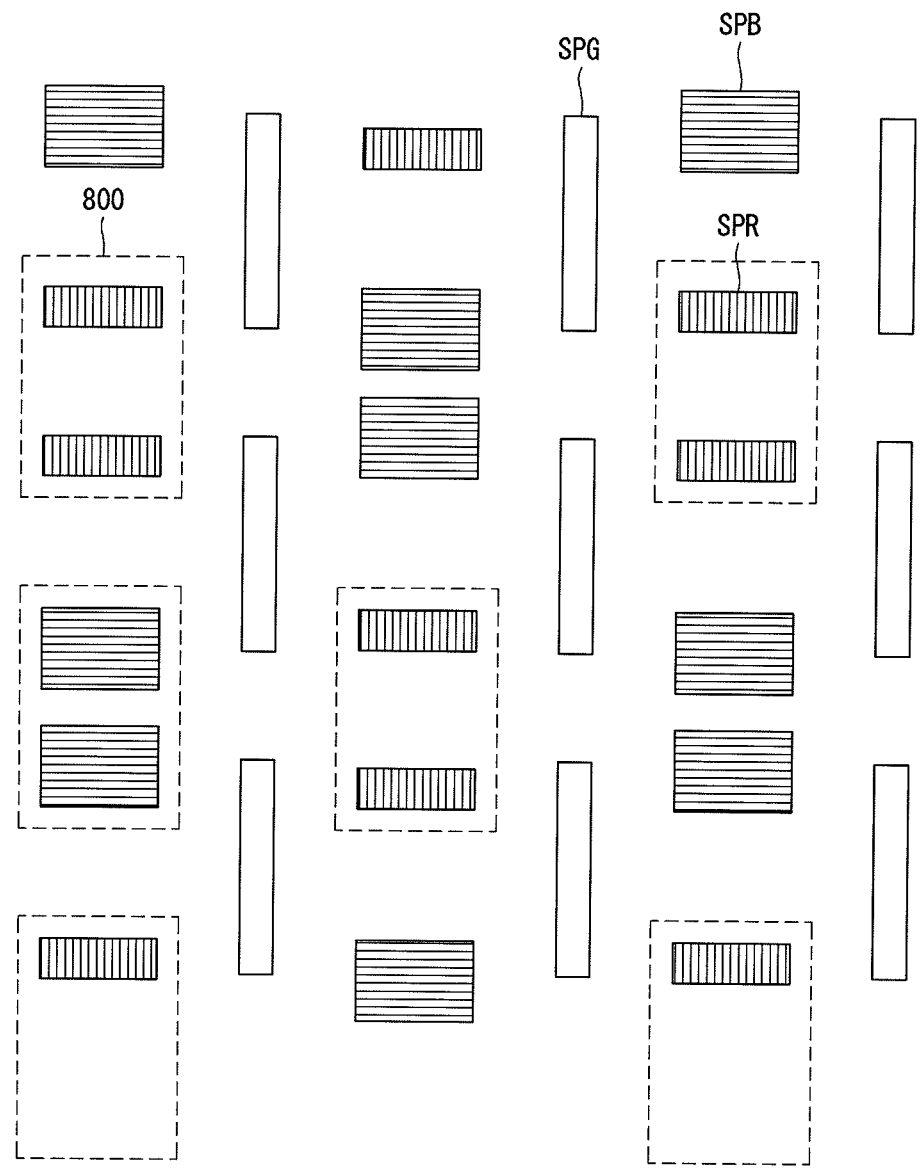
FIG. 8 illustrates openings of a shadow mask for forming a red light emitting layer using a FMM method in the subpixel arrangement structure illustrated in FIG. 3.

FIG. 8 illustrates openings 800 of a shadow mask aligned in the Y-axis direction for forming the red light emitting layers using the FMM method. The two red light emitting layers may be simultaneously deposited through the openings 800 of the shadow mask. Because the openings 800 of the shadow mask are formed in zigzags along the X-axis direction based on the arrangement structure of the green or blue subpixels SPG and SPB, the firmness of the shadow mask may be improved.

FIG. 9 illustrates another pixel group of the subpixel arrangement structure illustrated in FIG. 3. In FIG. 9, unlike the pixel group GPXL illustrated in FIG. 4, a green subpixel of each unit pixel is disposed on the right sides of red and blue subpixels of each unit pixel. As a result, the red and blue subpixels of each unit pixel are disposed opposite a left long side of the green subpixel. The pixel group shown in FIG. 9 has substantially the same subpixel arrangement structure as FIG. 4, except the above-described configuration.

More specifically, as shown in FIG. 9, a pixel group GPXL includes a first unit pixel PXL1 including subpixels having a first delta arrangement DA1, a second unit pixel PXL2 including subpixels having a second delta arrangement DA2, a third unit pixel PXL3 including subpixels having a third delta arrangement DA3, and a fourth unit pixel PXL4 including subpixels having a fourth delta arrangement DA4.

The first unit pixel PXL1 includes a first green subpixel SPG1 disposed on one (for example, the 1-1 subpixel arrangement line) of the first subpixel arrangement lines L#1, a first blue subpixel SPB1, that is partially opposite to an upper portion of a left long side of the first green subpixel SPG1, and a first red subpixel SPR1, that is disposed on the same subpixel arrangement line as the first blue subpixel SPB1 and is opposite to a lower portion of the left long side of the first green subpixel SPG1, thereby forming the first delta arrangement DA1. The first delta arrangement DA1 has a triangle structure obtained by connecting virtual central points (or virtual internal points) of the subpixels SPR1, SPG1, and SPB1 to one another.

The second unit pixel PXL2 includes a second green subpixel SPG2 disposed on the 1-2 subpixel arrangement line adjacent to the 1-1 subpixel arrangement line, a second red subpixel SPR2, that is opposite to an upper portion of a left long side of the second green subpixel SPG2, and a second blue subpixel SPB2, that is disposed on the same subpixel arrangement line as the second red subpixel SPR2 and is partially opposite to a lower portion of the left long side of the second green subpixel SPG2, thereby forming the second delta arrangement DA2. The second delta arrangement DA2 has a triangle structure obtained by connecting virtual central points (or virtual internal points) of the subpixels SPR2, SPG2, and SPB2 to one another.

The third unit pixel PXL3 includes a third green subpixel SPG3 disposed on the 1-2 subpixel arrangement line, a third blue subpixel SPB3, that is partially opposite to an upper portion of a left long side of the third green subpixel SPG3, and a third red subpixel SPR3, that is disposed on the same subpixel arrangement line as the third blue subpixel SPB3 and is opposite to a lower portion of the left long side of the third green subpixel SPG3, thereby forming the third delta arrangement DA3. The third delta arrangement DA3 has a triangle structure obtained by connecting virtual central points (or virtual internal points) of the subpixels SPR3, SPG3, and SPB3 to one another.

The fourth unit pixel PXL4 includes a fourth green subpixel SPG4 disposed on the 1-1 subpixel arrangement line, a fourth red subpixel SPR4, that is opposite to an upper portion of a left long side of the fourth green subpixel SPG4, and a fourth blue subpixel SPB4, that is disposed on the same subpixel arrangement line as the fourth red subpixel SPR4 and is partially opposite to a lower portion of the left long side of the fourth green subpixel SPG4, thereby forming the fourth delta arrangement DA4. The fourth delta arrangement DA4 has a triangle structure obtained by connecting virtual central points (or virtual internal points) of the subpixels SPR4, SPG4, and SPB4 to one another.

The first blue and red subpixels SPB1 and SPR1 and the fourth red and blue subpixels SPR4 and SPB4 are aligned on one (for example, the 2-1 subpixel arrangement line) of the second subpixel arrangement lines L#2. The second red and blue subpixels SPR2 and SPB2 and the third blue and red subpixels SPB3 and SPR3 are aligned on the 2-2 subpixel arrangement line adjacent to the 2-1 subpixel arrangement line.

Long axes of the red and blue subpixels SPR1-SPR4 and SPB1-SPB4 are perpendicular to long axes of the green subpixels SPG1-SPG4. Lengths of the long sides of the red and blue subpixels SPR1-SPR4 and SPB1-SPB4 may be substantially equal to one another and may be shorter than lengths of the long sides of the green subpixels SPG1-SPG4. The size of the blue subpixels SPB1-SPB4 having a relatively small contribution to the luminance may be greater than the size of the red subpixels SPR1-SPR4 having a relatively large contribution to the luminance.

When the Y-axis and the X-axis cross each other on a virtual central point VP2 (or virtual internal point) of the pixel group GPXL to form the quadrants I, II, III, and IV, the first delta arrangement DA1 may be positioned in the quadrant I (i.e., 0° to 90°), the second delta arrangement DA2 may be positioned in the quadrant II (i.e., 90° to 180°), the third delta arrangement DA3 may be positioned in the quadrant III (i.e., 180° to 270°), and the fourth delta arrangement DA4 may be positioned in the quadrant IV (i.e., 270° to 0°). Thus, the respective delta arrangements DA1, DA2, DA3 and DA 4 may be positioned in respective quadrants I, II, III, and IV counterclockwise with respect to the virtual central point VP 2. Further, a shortest distance D1 between the first unit pixel PXL1 and the virtual central point VP2, a shortest distance D2 between the second unit pixel PXL2 and the virtual central point VP2, a shortest distance D3 between the third unit pixel PXL3 and the virtual central point VP2, and a shortest distance D4 between the fourth unit pixel PXL4 and the virtual central point VP2 may be substantially equal to one another.

A reason to arrange the subpixels of each of the first to fourth unit pixels PXL1-PXL4 in the delta structure is to increase the aperture ratio in the X-axis and Y-axis directions. The first and third delta arrangements DA1 and DA3 of the first and third unit pixels PXL1 and PXL3 are substantially the same as each other in a first diagonal direction, and the second and fourth delta arrangements DA2 and DA4 of the second and fourth unit pixels PXL2 and PXL4 are substantially the same as each other in a second diagonal direction. Thus, the first and third delta arrangements DA1 and DA3 of the first and third unit pixels PXL1 and PXL3 have translational symmetry in the first diagonal direction, and the second and fourth delta arrangements DA2 and DA4 of the second and fourth unit pixels PXL2 and PXL4 have translational symmetry in the second diagonal direction. In the pixel group GPXL, 2-1 to 2-4 vertices V21-V24 of the first through fourth delta arrangements respectively corresponding to the central points of the green subpixels SPG1-SPG4 are directed toward a direction of about 0° (e.g., to the right of FIG. 9).

Figure 10:
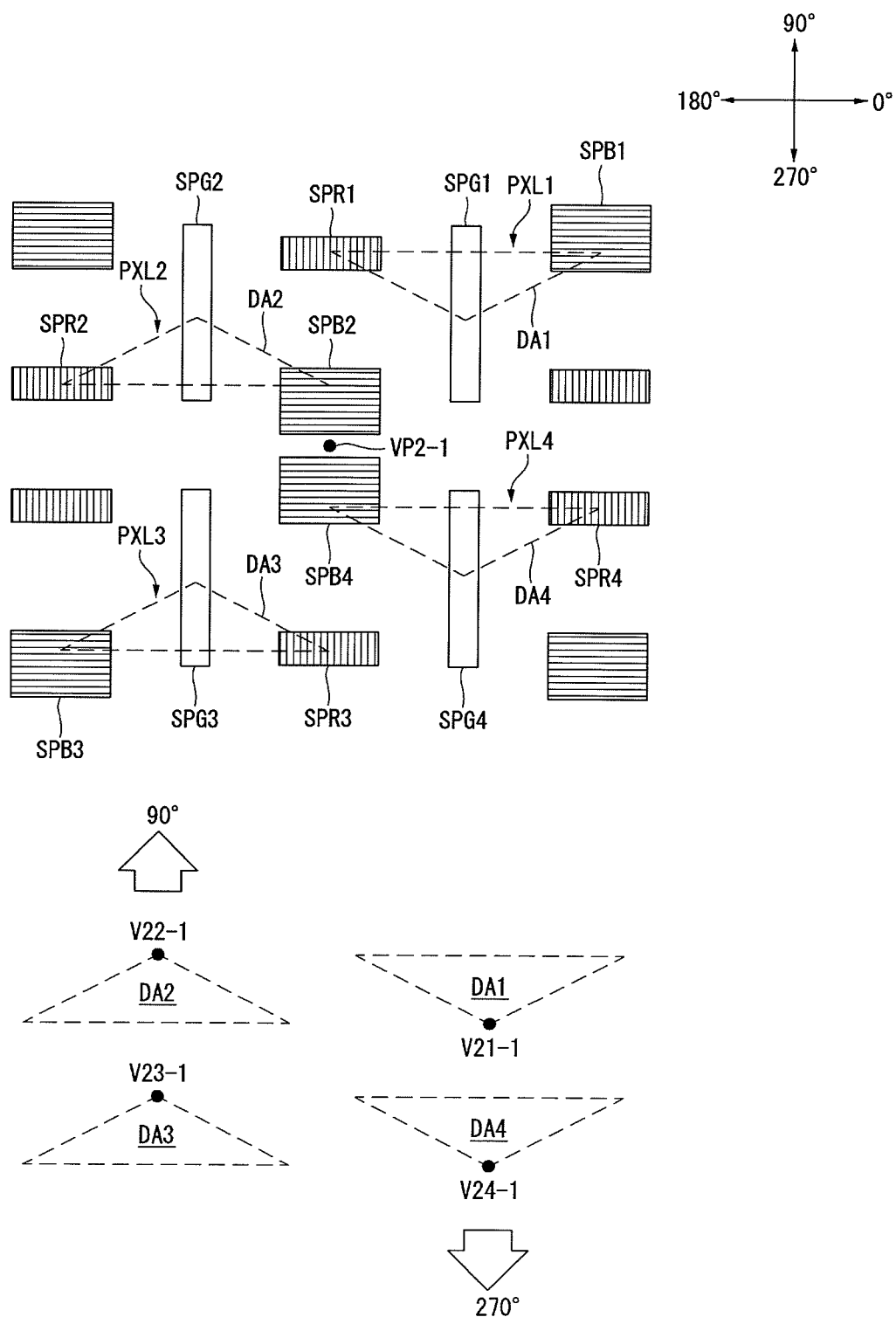
FIG. 10 illustrates another pixel group of the subpixel arrangement structure illustrated in FIG. 3.

FIG. 10 illustrates another pixel group of the subpixel arrangement structure illustrated in FIG. 3.

As shown in FIG. 10, a pixel group GPXL includes a first unit pixel PXL1 including subpixels having a first delta arrangement DA1, a second unit pixel PXL2 including subpixels having a second delta arrangement DA2, a third unit pixel PXL3 including subpixels having a third delta arrangement DA3, and a fourth unit pixel PXL4 including subpixels having a fourth delta arrangement DA4.

The first unit pixel PXL1 includes a first green subpixel SPG1 disposed on one (for example, the 1-1 subpixel arrangement line) of the first subpixel arrangement lines L#1, a first blue subpixel SPB1, that is disposed on one (for example, the 2-1 subpixel arrangement line) of the second subpixel arrangement lines L#2 and is partially opposite to an upper portion of a right long side of the first green subpixel SPG1, and a first red subpixel. SPR1, that is disposed on the 2-2 subpixel arrangement line of the second subpixel arrangement lines L#2 adjacent to the 2-1 subpixel arrangement line and is opposite to an upper portion of a left long side of the first green subpixel SPG1, thereby forming the first delta arrangement DA1. The first delta arrangement DA1 has a triangle structure obtained by connecting virtual central points (or virtual internal points) of the subpixels SPR1, SPG1, and SPB1 to one another.

The second unit pixel PXL2 includes a second green subpixel SPG2 disposed on the 1-2 subpixel arrangement line of the first subpixel arrangement lines L#1 adjacent to the 1-1 subpixel arrangement line, a second blue subpixel SPB2, that is disposed on the lower side of the first red subpixel SPR1 on the 2-2 subpixel arrangement line and is partially opposite to a lower portion of a right long side of the second green subpixel SPG2, and a second red subpixel SPR2, that is disposed on the 2-3 subpixel arrangement line of the second subpixel arrangement lines L#2 adjacent to the 2-2 subpixel arrangement line and is opposite to a lower portion of a left long side of the second green subpixel SPG2, thereby forming the second delta arrangement DA2. The second delta arrangement DA2 has a triangle structure obtained by connecting virtual central points (or virtual internal points) of the subpixels SPR2, SPG2, and SPB2 to one another.

The third unit pixel PXL3 includes a third green subpixel SPG3 disposed on the 1-2 subpixel arrangement line, a third red subpixel SPR3, that is disposed on the lower side of the second blue subpixel SPB2 on the 2-2 subpixel arrangement line and is opposite to a lower portion of a right long side of the third green subpixel SPG3, and a third blue subpixel SPB3, that is disposed on the lower side of the second red subpixel SPR2 on the 2-3 subpixel arrangement line and is partially opposite to a lower portion of a left long side of the third green subpixel SPG3, thereby forming the third delta arrangement DA3. The third delta arrangement DA3 has a triangle structure obtained by connecting virtual central points (or virtual internal points) of the subpixels SPR3, SPG3, and SPB3 to one another.

The fourth unit pixel PXL4 includes a fourth green subpixel SPG4 disposed on the 1-1 subpixel arrangement line, a fourth red subpixel SPR4, that is disposed on the lower side of the first blue subpixel SPB1 on the 2-1 subpixel arrangement line and is opposite to an upper portion of a right long side of the fourth green subpixel SPG4, and a fourth blue subpixel SPB4, that is disposed between the second blue subpixel SPB2 and the third red subpixel SPR3 on the 2-2 subpixel arrangement line and is partially opposite to an upper portion of a left long side of the fourth green subpixel SPG4, thereby forming the fourth delta arrangement DA4. The fourth delta arrangement DA4 has a triangle structure obtained by connecting virtual central points (or virtual internal points) of the subpixels SPR4, SPG4, and SPB4 to one another.

Long axes of the red and blue subpixels SPR1-SPR4 and SPB1-SPB4 are perpendicular to long axes of the green subpixels SPG1-SPG4. Lengths of the long sides of the red and blue subpixels SPR1-SPR4 and SPB1-SPB4 may be substantially equal to one another and may be shorter than lengths of the long sides of the green subpixels SPG1-SPG4. The size of the blue subpixels SPB1-SPB4 having a relatively small contribution to the luminance may be greater than the size of the red subpixels SPR1-SPR4 having a relatively large contribution to the luminance.

A reason to arrange the subpixels of each of the first to fourth unit pixels PXL1-PXL4 in the delta structure is to increase the aperture ratio in the X-axis and Y-axis directions. The first and third delta arrangements DA1 and DA3 of the first and third unit pixels PXL1 and PXL3 have symmetry in a first diagonal direction, and the second and fourth delta arrangements DA2 and DA4 of the second and fourth unit pixels PXL2 and PXL4 have symmetry in a second diagonal direction. Namely, the first and third delta arrangements DA1 and DA3 of the first and third unit pixels PXL1 and PXL3 have point symmetry with respect to a virtual central point VP2-1 of the pixel group GPXL, and the second and fourth delta arrangements DA2 and DA4 of the second and fourth unit pixels PXL2 and PXL4 have point symmetry with respect to the virtual central point VP2-1. In the pixel group GPXL, vertices V21-1 and V24-1 of the first and fourth delta arrangements DA1 and DA4 respectively corresponding to the central points of the first and fourth green subpixels SPG1 and SPG4 are directed toward a direction of about 270°. Further, vertices V22-1 and V23-1 of the second and third delta arrangements DA2 and DA3 respectively corresponding to the central points of the second and third green subpixels SPG2 and SPG3 are directed toward a direction of about 90°.

Figure 11:
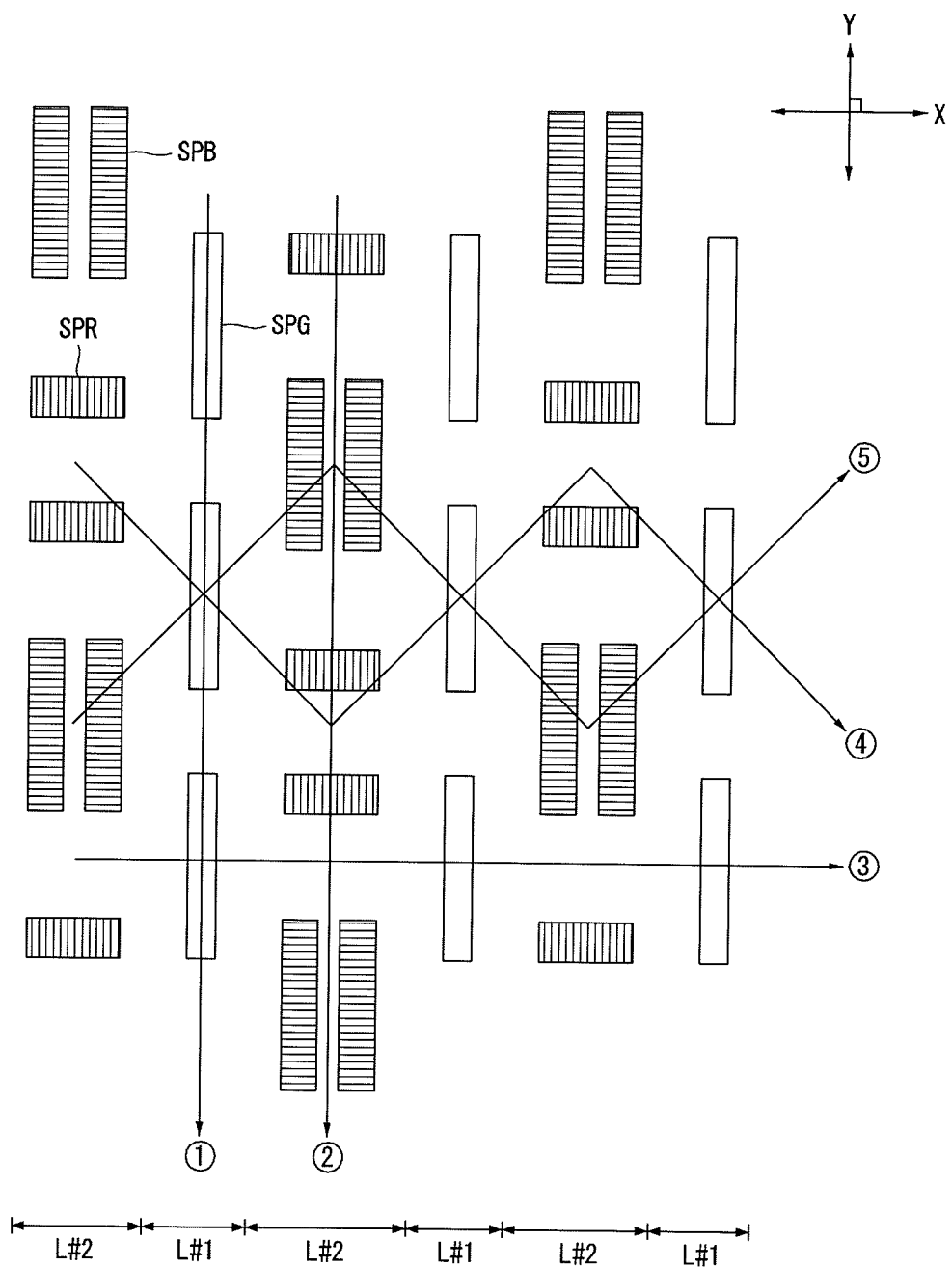
FIG. 11 illustrates a second subpixel arrangement structure for a display device according to an example embodiment of the invention.

FIG. 11 illustrates a second subpixel arrangement structure for the display device according to the example embodiment of the invention. In FIG. 11, unlike the first subpixel arrangement structure illustrated in FIG. 3, two red subpixels SPR and two blue subpixels SPB are alternately disposed along the Y-axis direction, and the two blue subpixels SPB each have a long axis of the Y-axis direction and are positioned adjacent to each other in the X-axis direction. The second subpixel arrangement structure illustrated in FIG. 11 is substantially the same as the first subpixel arrangement structure illustrated in FIG. 3, except the above-described configuration.

As shown in FIG. 11, in the second subpixel arrangement structure for the display device, green subpixels SPG are disposed on each of first subpixel arrangement lines L#1 extending along the Y-axis direction. Further, two red subpixels SPR and two blue subpixels SPB are alternately disposed along the Y-axis direction on second subpixel arrangement lines L#2, each of which is positioned between the every two first subpixel arrangement lines L#1 and extends along the Y-axis direction.

More specifically, the green subpixels SPG are aligned on each first subpixel arrangement line L#1 along the Y-axis direction as indicated by ① of FIG. 11. A long side of the green subpixel SPG having a rectangular shape is parallel to the Y-axis. The two red subpixels SPR and the two blue subpixels SPB are alternately aligned on each second subpixel arrangement line L#2 along the Y-axis direction as indicated by ② of FIG. 11. Long axes of the red subpixels SPR having a rectangular shape are parallel to the X-axis, and long axes of the blue subpixels SPB having a rectangular shape are parallel to the Y-axis. The two red subpixels SPR, which are positioned adjacent to each other in the Y-axis direction, form a pair, and the two blue subpixels SPB, which are positioned adjacent to each other in the X-axis direction, form a pair.

Further, the green subpixels SPG are aligned along the X-axis direction as indicated by ③ of FIG. 11. A plurality of red subpixel pairs each including the two red subpixels SPR, which are positioned adjacent to each other in the Y-axis direction, are aligned in zigzags along the X-axis direction based on a first zigzag arrangement pattern as indicated by ④ of FIG. 11. A plurality of blue subpixel pairs each including the two blue subpixels SPB, which are positioned adjacent to each other in the X-axis direction, are aligned in zigzags along the X-axis direction based on a second zigzag arrangement pattern as indicated by ⑤ of FIG. 11. The second zigzag arrangement pattern is reverse to the first zigzag arrangement pattern.

Figure 12:
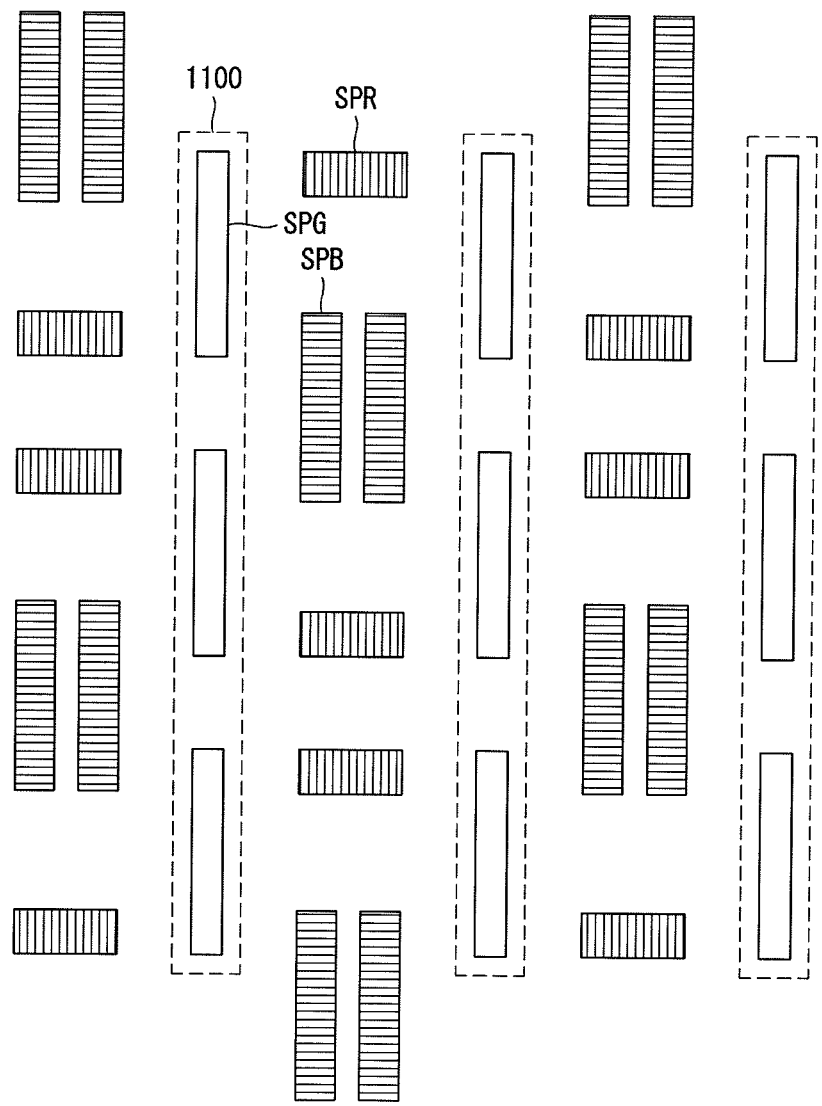
FIG. 12 illustrates openings of a shadow mask for forming a green light emitting layer using a FMM method in the subpixel arrangement structure illustrated in FIG. 11.
Figure 13:
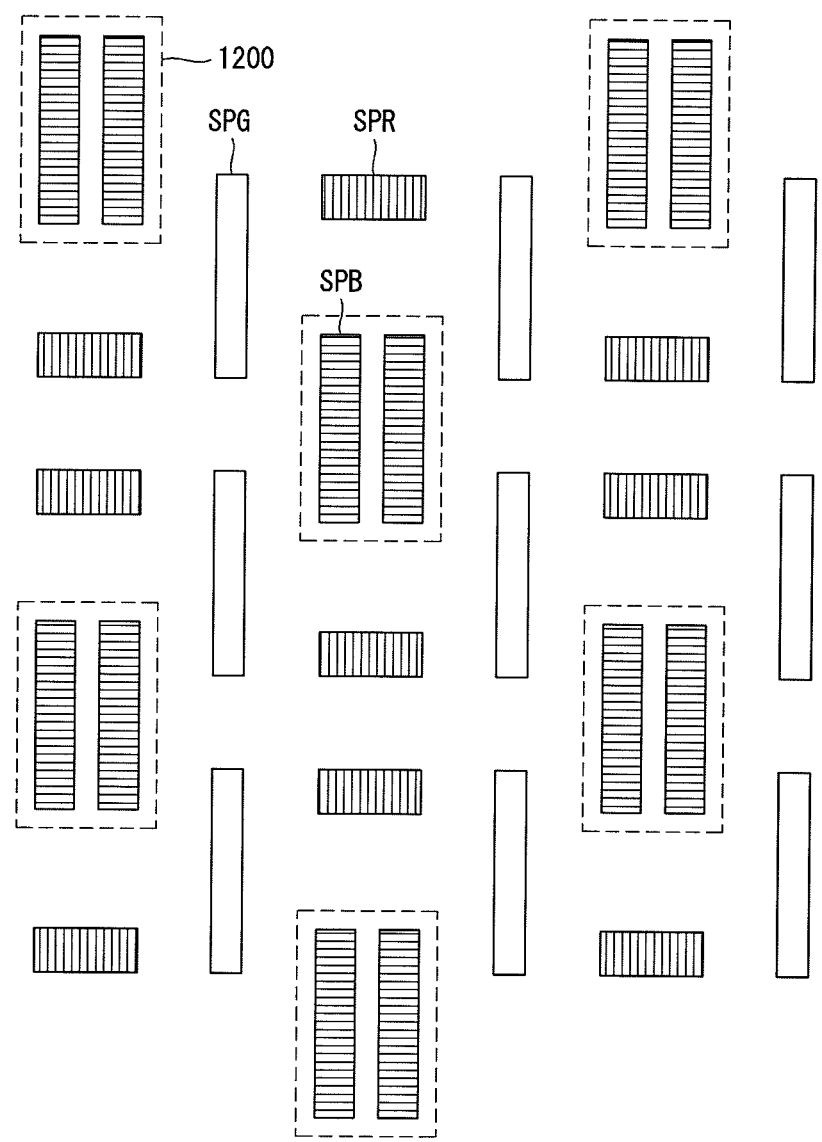
FIG. 13 illustrates openings of a shadow mask for forming a blue light emitting layer using a FMM method in the subpixel arrangement structure illustrated in FIG. 11.
Figure 14:
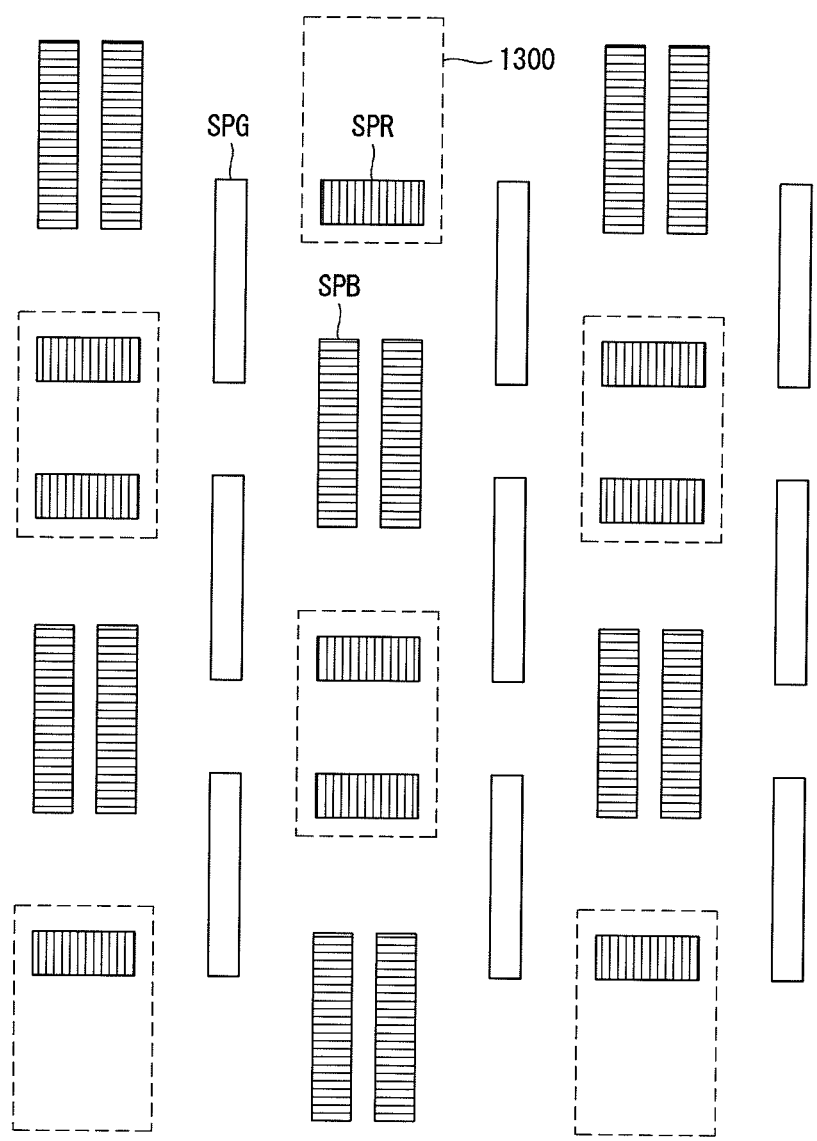
FIG. 14 illustrates openings of a shadow mask for forming a red light emitting layer using a FMM method in the subpixel arrangement structure illustrated in FIG. 11.

Green light emitting layers included in the green subpixels SPG may be deposited through openings 1100 of a shadow mask shown in FIG. 12. The shadow mask shown in FIG. 12 has substantially the same configuration as the shadow mask shown in FIG. 6. Blue light emitting layers included in the blue subpixels SPB may be deposited through openings 1200 of a shadow mask shown in FIG. 13. The shadow mask shown in FIG. 13 has substantially the same configuration as the shadow mask shown in FIG. 7. Red light emitting layers included in the red subpixels SPR may be deposited through openings 1300 of a shadow mask shown in FIG. 14. The shadow mask shown in FIG. 14 has substantially the same configuration as the shadow mask shown in FIG. 8.

In the above-described second subpixel arrangement structure for the display device, the adjacently disposed red, green, and blue subpixels SPR, SPG, and SPB form the delta arrangement structure to constitute one unit pixel. The display panel 100 has the subpixel arrangement structure in which the pixel group GPXL including four unit pixels is repeatedly disposed. The pixel group GPXL including the four unit pixels each having the delta arrangement structure may be configured as shown in FIG. 15 or as shown in FIG. 16.

Figure 15:
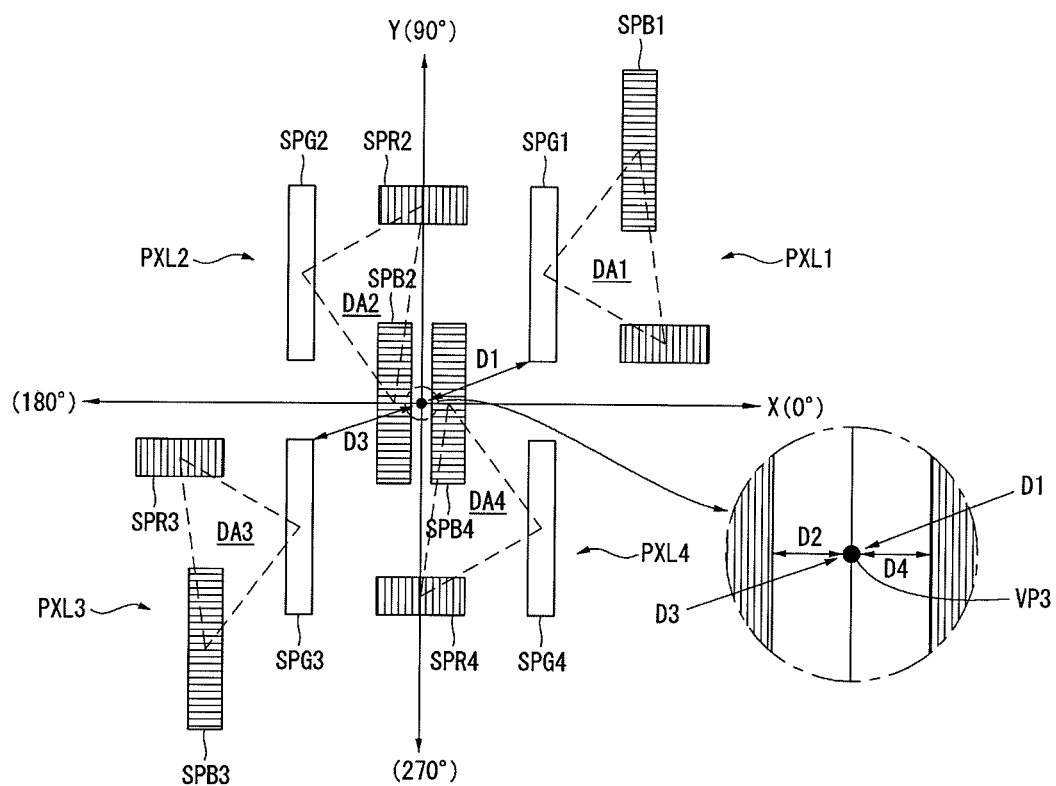
FIG. 15 illustrates a pixel group of the subpixel arrangement structure illustrated in FIG. 11.
Figure 15:
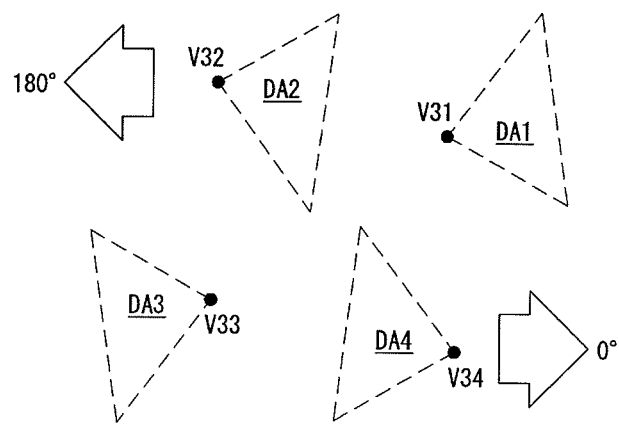
Figure 16:
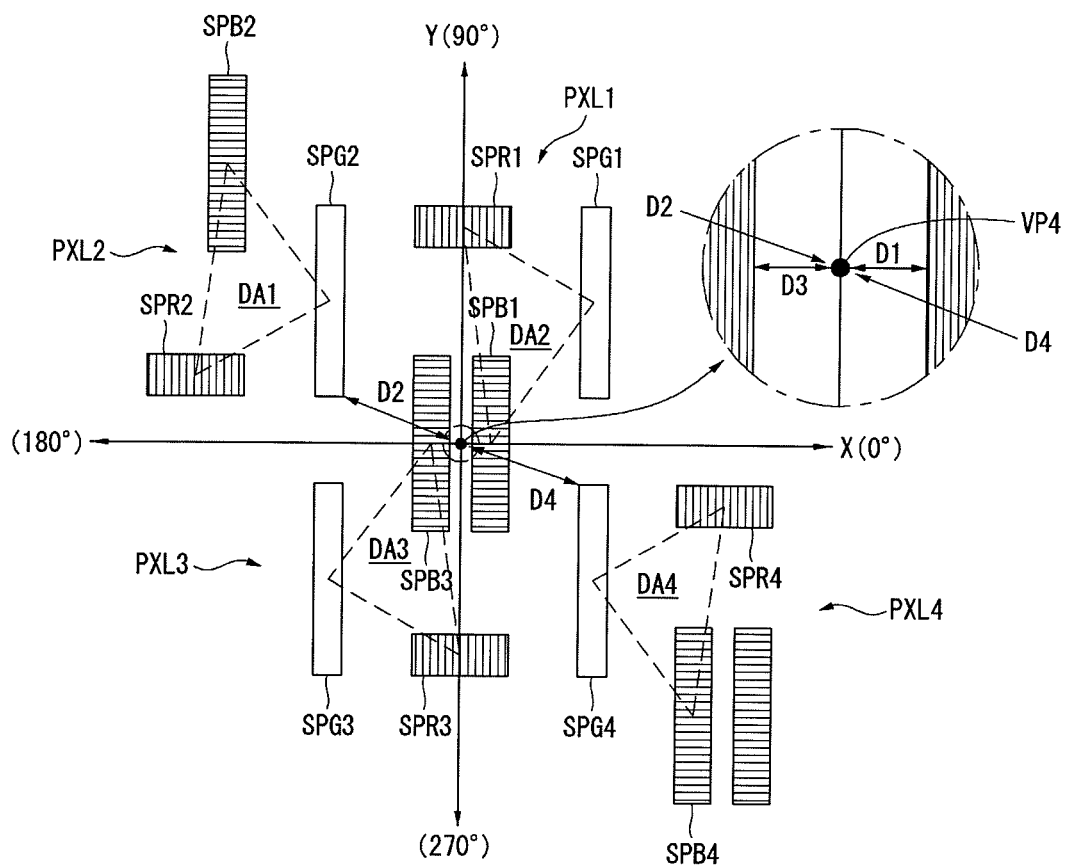
FIG. 16 illustrates another pixel group of the subpixel arrangement structure illustrated in FIG. 11.
Figure 16:
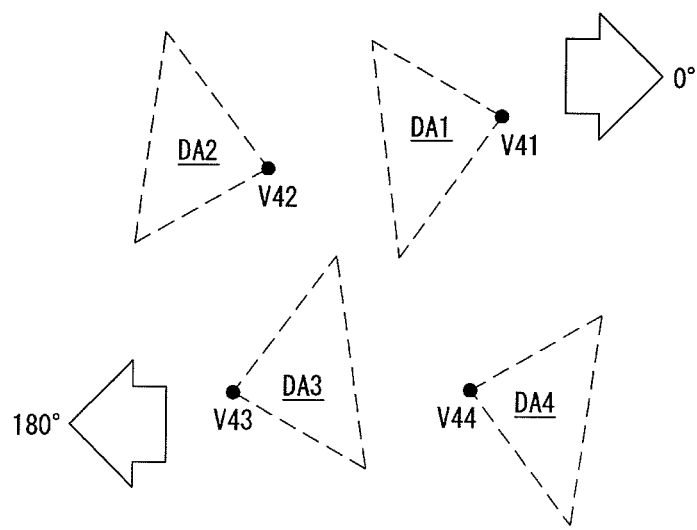

FIG. 15 illustrates a pixel group of the subpixel arrangement structure illustrated in FIG. 11.

As shown in FIG. 15, a pixel group GPXL includes a first unit pixel PXL1 including subpixels having a first delta arrangement DA1, a second unit pixel PXL2 including subpixels having a second delta arrangement DA2, a third unit pixel PXL3 including subpixels having a third delta arrangement DA3, and a fourth unit pixel PXL4 including subpixels having a fourth delta arrangement DA4.

The first unit pixel PXL1 includes a first green subpixel SPG1 disposed on one (for example, a 1-1 subpixel arrangement line) of the first subpixel arrangement lines L#1, a first blue subpixel SPB1, that is partially opposite to an upper portion of a right long side of the first green subpixel SPG1, and a first red subpixel SPR1, that is disposed on the same subpixel arrangement line as the first blue subpixel SPB1 and is opposite to a lower portion of the right long side of the first green subpixel SPG1, thereby forming the first delta arrangement DA1. The first delta arrangement DA1 has a triangle structure obtained by connecting virtual central points (or virtual internal points) of the subpixels SPR1, SPG1, and SPB1 to one another.

The second unit pixel PXL2 includes a second green subpixel SPG2 disposed on a 1-2 subpixel arrangement line adjacent to the 1-1 subpixel arrangement line, a second red subpixel SPR2, that is opposite to an upper portion of a right long side of the second green subpixel SPG2, and a second blue subpixel SPB2, that is disposed on the same subpixel arrangement line as the second red subpixel SPR2 and is partially opposite to a lower portion of the right long side of the second green subpixel SPG2, thereby forming the second delta arrangement DA2. The second delta arrangement DA2 has a triangle structure obtained by connecting virtual central points (or virtual internal points) of the subpixels SPR2, SPG2, and SPB2 to one another.

The third unit pixel PXL3 includes a third green subpixel SPG3 disposed on the 1-2 subpixel arrangement line, a third red subpixel SPR3, that is opposite to an upper portion of a left long side of the third green subpixel SPG3, and a third blue subpixel SPB3, that is disposed on the same subpixel arrangement line as the third red subpixel SPR3 and is partially opposite to a lower portion of the left long side of the third green subpixel SPG3, thereby forming the third delta arrangement DA3. The third delta arrangement DA3 has a triangle structure obtained by connecting virtual central points (or virtual internal points) of the subpixels SPR3, SPG3, and SPB3 to one another.

The fourth unit pixel PXL4 includes a fourth green subpixel SPG4 disposed on the 1-1 subpixel arrangement line, a fourth blue subpixel SPB4, that is partially opposite to an upper portion of a left long side of the fourth green subpixel SPG4, and a fourth red subpixel SPR4, that is disposed on the same subpixel arrangement line as the fourth blue subpixel SPB4 and is opposite to a lower portion of the left long side of the fourth green subpixel SPG4, thereby forming the fourth delta arrangement DA4. The fourth delta arrangement DA4 has a triangle structure obtained by connecting virtual central points (or virtual internal points) of the subpixels SPR4, SPG4, and SPB4 to one another.

The first blue and red subpixels SPB1 and SPR1 are aligned on one (for example, a 2-1 subpixel arrangement line) of the second subpixel arrangement lines L#2. The second red and blue subpixels SPR2 and SPB2 and the fourth red and blue subpixels SPR4 and SPB4 are aligned on a 2-2 subpixel arrangement line adjacent to the 2-1 subpixel arrangement line. The third blue and red subpixels SPB3 and SPR3 are aligned on a 2-3 subpixel arrangement line adjacent to the 2-2 subpixel arrangement line.

Long axes of the red subpixels SPR1-SPR4 are perpendicular to long axes of the green subpixels SPG1-SPG4, and long axes of the blue subpixels SPB1-SPB4 are parallel to the long axes of the green subpixels SPG1-SPG4. Lengths of long sides of the red subpixels SPR1-SPR4 may be shorter than lengths of the long sides of the green subpixels SPG1-SPG4. Lengths of long sides of the blue subpixels SPB1-SPB4 may be substantially equal to or different from the lengths of the long sides of the green subpixels SPG1-SPG4. The size of the blue subpixels SPB1-SPB4 having a relatively small contribution to the luminance may be greater than the size of the red subpixels SPR1-SPR4 having a relatively large contribution to the luminance.

When the Y-axis and the X-axis cross each other on a virtual central point VP3 (or virtual internal point) of the pixel group GPXL to form the quadrants I, II, III, and IV, the first delta arrangement DA1 may be positioned in the quadrant I (i.e., 0° to 90°), the second delta arrangement DA2 may be positioned in the quadrant II (i.e., 90° to 180°), the third delta arrangement DA3 may be positioned in the quadrant III (i.e., 180° to 270°), and the fourth delta arrangement DA4 may be positioned in the quadrant IV (i.e., 270° to 0°). Thus, the respective delta arrangements DA1, DA2, DA3 and DA 4 may be positioned in respective quadrants I, II, III, and IV counterclockwise with respect to the virtual central point VP 3.

Shortest distances between the first and third unit pixels PXL1 and PXL3 and the virtual central point VP3 may be longer than shortest distances between the second and fourth unit pixels PXL2 and PXL4 and the virtual central point VP3. More specifically, a shortest distance D1 between the first unit pixel PXL1 and the virtual central point VP3 and a shortest distance D3 between the third unit pixel PXL3 and the virtual central point VP3 may be set to the same first value. A shortest distance D2 between the second unit pixel PXL2 and the virtual central point VP3 and a shortest distance D4 between the fourth unit pixel PXL4 and the virtual central point VP3 may be set to the same second value less than the first value.

A reason to arrange the subpixels of each of the first to fourth unit pixels PXL1-PXL4 in the delta structure is to increase the aperture ratio in the X-axis and Y-axis directions. The first and third delta arrangements DA1 and DA3 of the first and third unit pixels PXL1 and PXL3 have symmetry in a first diagonal direction, and the second and fourth delta arrangements DA2 and DA4 of the second and fourth unit pixels PXL2 and PXL4 have symmetry in a second diagonal direction. Thus, the first and third delta arrangements DA1 and DA3 of the first and third unit pixels PXL1 and PXL3 have point symmetry with respect to the virtual central point VP3, and the second and fourth delta arrangements DA2 and DA4 of the second and fourth unit pixels PXL2 and PXL4 have point symmetry with respect to the virtual central point VP3.

In the pixel group GPXL, 3-1 and 3-2 vertices V31 and V32 of the first and second delta arrangements respectively corresponding to the central points of the first and second green subpixels SPG1 and SPG2 are directed toward a direction of about 180°. Further, 3-3 and 3-4 vertices V33 and V34 of the third and fourth delta arrangements respectively corresponding to the central points of the third and fourth green subpixels SPG3 and SPG4 are directed toward a direction of about 0°.

FIG. 16 illustrates another pixel group of the subpixel arrangement structure illustrated in FIG. 11. In FIG. 16, unlike the pixel group GPXL illustrated in FIG. 15, green subpixels of first and second unit pixels are disposed on the right sides of red and blue subpixels of the first and second unit pixels, and green subpixels of third and fourth unit pixels are disposed on the left sides of red and blue subpixels of the third and fourth unit pixels. As a result, the red and blue subpixels of the first and second unit pixels are disposed opposite a left long side of the green subpixels of the first and second unit pixels, and the red and blue subpixels of the third and fourth unit pixels are disposed opposite a right long side of the green subpixels of the third and fourth unit pixels.

More specifically, as shown in FIG. 16, a pixel group GPXL includes a first unit pixel PXL1 including subpixels having a first delta arrangement DA1, a second unit pixel PXL2 including subpixels having a second delta arrangement DA2, a third unit pixel PXL3 including subpixels having a third delta arrangement DA3, and a fourth unit pixel PXL4 including subpixels having a fourth delta arrangement DA4.

The first unit pixel PXL1 includes a first green subpixel SPG1 disposed on one (for example, the 1-1 subpixel arrangement line) of the first subpixel arrangement lines L#1, a first red subpixel SPR1, that is opposite to an upper portion of a left long side of the first green subpixel SPG1, and a first blue subpixel SPB1, that is disposed on the same subpixel arrangement line as the first red subpixel SPR1 and is partially opposite to a lower portion of the left long side of the first green subpixel SPG1, thereby forming the first delta arrangement DA1. The first delta arrangement DA1 has a triangle structure obtained by connecting virtual central points (or virtual internal points) of the subpixels SPR1, SPG1, and SPB1 to one another.

The second unit pixel PXL2 includes a second green subpixel SPG2 disposed on the 1-2 subpixel arrangement line adjacent to the 1-1 subpixel arrangement line, a second blue subpixel SPB2, that is partially opposite to an upper portion of a left long side of the second green subpixel SPG2, and a second red subpixel SPR2, that is disposed on the same subpixel arrangement line as the second blue subpixel SPB2 and is opposite to a lower portion of the left long side of the second green subpixel SPG2, thereby forming the second delta arrangement DA2. The second delta arrangement DA2 has a triangle structure obtained by connecting virtual central points (or virtual internal points) of the subpixels SPR2, SPG2, and SPB2 to one another.

The third unit pixel PXL3 includes a third green subpixel SPG3 disposed on the 1-2 subpixel arrangement line, a third blue subpixel SPB3, that is partially opposite to an upper portion of a right long side of the third green subpixel SPG3, and a third red subpixel SPR3, that is disposed on the same subpixel arrangement line as the third blue subpixel SPB3 and is opposite to a lower portion of the right long side of the third green subpixel SPG3, thereby forming the third delta arrangement DA3. The third delta arrangement DA3 has a triangle structure obtained by connecting virtual central points (or virtual internal points) of the subpixels SPR3, SPG3, and SPB3 to one another.

The fourth unit pixel PXL4 includes a fourth green subpixel SPG4 disposed on the 1-1 subpixel arrangement line, a fourth red subpixel SPR4, that is opposite to an upper portion of a right long side of the fourth green subpixel SPG4, and a fourth blue subpixel SPB4, that is disposed on the same subpixel arrangement line as the fourth red subpixel SPR4 and is partially opposite to a lower portion of the right long side of the fourth green subpixel SPG4, thereby forming the fourth delta arrangement DA4. The fourth delta arrangement DA4 has a triangle structure obtained by connecting virtual central points (or virtual internal points) of the subpixels SPR4, SPG4, and SPB4 to one another.

The fourth red and blue subpixels SPR4 and SPB4 are aligned on one (for example, a 2-1 subpixel arrangement line) of the second subpixel arrangement lines L#2. The first red and blue subpixels SPR1 and SPB1 and the third red and blue subpixels SPR3 and SPB3 are aligned on a 2-2 subpixel arrangement line adjacent to the 2-1 subpixel arrangement line. The second red and blue subpixels SPR2 and SPB2 are aligned on a 2-3 subpixel arrangement line adjacent to the 2-2 subpixel arrangement line.

Long axes of the red subpixels SPR1-SPR4 are perpendicular to long axes of the green subpixels SPG1-SPG4, and long axes of the blue subpixels SPB1-SPB4 are parallel to the long axes of the green subpixels SPG1-SPG4. Lengths of long sides of the red subpixels SPR1-SPR4 may be shorter than lengths of the long sides of the green subpixels SPG1-SPG4. Lengths of long sides of the blue subpixels SPB1-SPB4 may be substantially equal to or different from the lengths of the long sides of the green subpixels SPG1-SPG4. The size of the blue subpixels SPB1-SPB4 having a relatively small contribution to the luminance may be greater than the size of the red subpixels SPR1-SPR4 having a relatively large contribution to the luminance.

When the Y-axis and the X-axis cross each other on a virtual central point VP4 (or virtual internal point) of the pixel group GPXL to form the quadrants I, II, III, and IV, the first delta arrangement DA1 may be positioned in the quadrant I (i.e., 0° to 90°), the second delta arrangement DA2 may be positioned in the quadrant II (i.e., 90° to 180°), the third delta arrangement DA3 may be positioned in the quadrant III (i.e., 180° to 270°), and the fourth delta arrangement DA4 may be positioned in the quadrant IV (i.e., 270° to 0°). Thus, the respective delta arrangements DA1, DA2, DA3 and DA 4 may be positioned in respective quadrants I, II, III, and IV counterclockwise with respect to the virtual central point VP 4.

Shortest distances between the first and third unit pixels PXL1 and PXL3 and the virtual central point VP4 may be shorter than shortest distances between the second and fourth unit pixels PXL2 and PXL4 and the virtual central point VP4. More specifically, a shortest distance D1 between the first unit pixel PXL1 and the virtual central point VP4 and a shortest distance D3 between the third unit pixel PXL3 and the virtual central point VP4 may be set to the same first value. A shortest distance D2 between the second unit pixel PXL2 and the virtual central point VP4 and a shortest distance D4 between the fourth unit pixel PXL4 and the virtual central point VP4 may be set to the same second value greater than the first value.

A reason to arrange the subpixels of each of the first to fourth unit pixels PXL1-PXL4 in the delta structure is to increase the aperture ratio in the X-axis and Y-axis directions. The first and third delta arrangements DA1 and DA3 of the first and third unit pixels PXL1 and PXL3 have symmetry in a first diagonal direction, and the second and fourth delta arrangements DA2 and DA4 of the second and fourth unit pixels PXL2 and PXL4 have symmetry in a second diagonal direction. Thus, the first and third delta arrangements DA1 and DA3 of the first and third unit pixels PXL1 and PXL3 have point symmetry with respect to the virtual central point VP4, and the second and fourth delta arrangements DA2 and DA4 of the second and fourth unit pixels PXL2 and PXL4 have point symmetry with respect to the virtual central point VP4.

In the pixel group GPXL, 4-1 and 4-2 vertices V41 and V42 of the first and second delta arrangements respectively corresponding to the central points of the first and second green subpixels SPG1 and SPG2 are directed toward a direction of about 0°. Further, 4-3 and 4-4 vertices V43 and V44 of the third and fourth delta arrangements respectively corresponding to the central points of the third and fourth green subpixels SPG3 and SPG4 are directed toward a direction of about 180°.

As described above, the subpixel arrangement structure for the display device according to the embodiments of the invention may prevent a reduction in display quality while increasing the aperture ratio and the luminance. For example, the display device according to the embodiments of the invention may obtain a luminance of 150 cd/m$^2$ under the same process conditions as the existing RGB stripe structure without causing the reduction in display quality, as compared to a luminance of 100 cd/m$^2$ obtained in the existing RGB stripe structure. Additionally, references to elements being opposite may refer to such elements facing each other. Such opposite elements may also be at close proximity.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A subpixel arrangement structure for a display device, comprising:
a plurality of unit pixels each having a pixel unit including a red subpixel, a green subpixel, and a blue subpixel, the red, green, and blue subpixels forming a single delta arrangement within the pixel unit and each of the red, blue and green subpixels having a long axis and a short axis, wherein the long axis is longer than the short axis,
wherein green subpixels are disposed on a plurality of first subpixel arrangement lines, each of which extends along a direction of a first axis, and the red and blue subpixels are disposed on a plurality of second subpixel arrangement lines, each of which extends along a direction of the first axis,
wherein two red subpixels and two blue subpixels of two adjacent pixel units are alternately disposed on both sides of the first axis on a plurality of second subpixel arrangement lines, each of the plurality of second subpixel arrangement lines being positioned between every two of the plurality of first subpixel arrangement lines and extending along the first axis,
wherein the green subpixel of the pixel unit is disposed immediately adjacent to and on a left side of the red and blue subpixels within the pixel unit, the long axis unit of the green subpixel is parallel to the first axis, and the red and blue subpixels within the pixel unit are disposed immediately adjacent to and opposite a right side of the green subpixel within the pixel unit, the long axes of the red and blue subpixels are parallel to a second axis, and
wherein the two adjacent pixel units have different subpixel arrangements.

2. The subpixel arrangement structure of claim 1, wherein the green subpixels are further disposed along a direction of the second axis perpendicular to the first axis,
a plurality of red subpixel pairs each including the red subpixels are disposed in zigzags along the second axis direction based on a first arrangement pattern,
a plurality of blue subpixel pairs each including the two blue subpixels are disposed in zigzags along the second axis direction based on a second zigzag arrangement pattern, and
the second zigzag arrangement pattern is reverse to the first zigzag arrangement pattern.

3. The subpixel arrangement structure of claim 1, wherein four unit pixels constitute a pixel group, and
each pixel group includes a green subpixel disposed on one of the first subpixel arrangement lines, and a red subpixel and a blue subpixel disposed on one of the second subpixel arrangement lines.

4. The subpixel arrangement structure of claim 2, wherein four unit pixels constitute a pixel group, and each pixel group includes a first unit pixel including subpixels having a first delta arrangement, a second unit pixel including subpixels having a second delta arrangement, a third unit pixel including subpixels having a third delta arrangement, and fourth unit pixel including subpixels having a fourth delta arrangement.

5. The subpixel arrangement structure of claim 4, wherein the two red subpixels, which are positioned adjacent to each other in the first axis direction, form a pair, and the two blue subpixels, which are positioned adjacent to each other in the first axis direction, form a pair.

6. The subpixel arrangement structure of claim 5, wherein the first unit pixel includes a first green subpixel disposed on a 1-1 subpixel arrangement line being one of the plurality of first subpixel arrangement lines, a first blue subpixel that is partially opposite to an upper portion of a side of the first green subpixel, and a first red subpixel that is disposed on the same subpixel arrangement line as the first blue subpixel and is opposite to a lower portion of the side of the first green subpixel,
wherein the second unit pixel includes a second green subpixel disposed on a 1-2 subpixel arrangement line of the plurality of first subpixel arrangement lines adjacent to the 1-1 subpixel arrangement line, a second red subpixel that is opposite to an upper portion of a side of the second green subpixel, and a second blue subpixel that is disposed on the same subpixel arrangement line as the second red subpixel and is partially opposite to a lower portion of the side of the second green subpixel,
wherein the third unit pixel includes a third green subpixel disposed on the 1-2 subpixel arrangement line, a third blue subpixel that is partially opposite to an upper portion of a side of the third green subpixel, and a third red subpixel that is disposed on the same subpixel arrangement line as the third blue subpixel and is opposite to a lower portion of the side of the third green subpixel, and
the fourth unit pixel includes a fourth green subpixel disposed on the 1-1 subpixel arrangement line, a fourth red subpixel that is opposite to an upper portion of a side of the fourth green subpixel, and a fourth blue subpixel that is disposed on the same subpixel arrangement line as the fourth red subpixel and is partially opposite to a lower portion of the side of the fourth green subpixel.

7. The subpixel arrangement structure of claim 6, wherein the first blue and red subpixels and the fourth red and blue subpixels are aligned on a 2-1 subpixel arrangement line being one of the plurality of second subpixel arrangement lines, and
the second red and blue subpixels and the third blue and red subpixels are aligned on a 2-2 subpixel arrangement line of the plurality of second subpixel arrangement lines adjacent to the 2-1 subpixel arrangement line.

8. The subpixel arrangement structure of claim 7, wherein when the first axis and the second axis cross each other on a virtual central point of the pixel group to form quadrants I, II, III, and IV, the first, second, third, and fourth delta arrangements are positioned n the quadrants I, II, III, and IV, respectively, in a counterclockwise direction about the virtual central point, and
a shortest distance between the first unit pixel and the virtual central point, a shortest distance between the second unit pixel and the virtual central point, a shortest distance between the third unit pixel and the virtual central point, and a shortest distance between the fourth unit pixel and the virtual central point are substantially equal to one another.

9. The subpixel arrangement structure of claim 5, wherein the first and third delta arrangements of the first and third unit pixels have translational symmetry, and
the second and fourth delta arrangements of the second and fourth unit pixels have translational symmetry.

10. The subpixel arrangement structure of claim 6, wherein the side of each of the first to fourth green subpixels indicates a right side of each of the first to fourth green subpixels, and
- 1-1 to 1-4 vertices of the first to fourth delta arrangements respectively corresponding to central points of the first to fourth green subpixels are directed toward a direction of about 180°.

11. A display device, comprising:
- substrate having a plurality of unit pixels, each having a pixel unit including a red subpixel, a green subpixel, and a blue subpixel disposed with a single delta arrangement within the pixel unit and each of the red, green and blue subpixels having a long, axis and a short axis, wherein the long axis is longer than the short axis,
- wherein green subpixels are disposed on a plurality of first subpixel lines extended along a direction of a first axis, and
- two red subpixels and two blue subpixels of two adjacent pixel units are positioned on both sides of plurality of first subpixel lines, on a plurality of second subpixel lines extended along a direction of the first axis, and are arranged between the plurality of first subpixel lines,
- wherein the green subpixel of the pixel unit is disposed immediately adjacent to and on a left side of the red and blue subpixels within the pixel unit, the long axis of the green subpixel is parallel to the first axis, and the red and blue subpixels within the pixel unit are disposed immediately adjacent to and opposite a right side of the green subpixel unit, the long axes of the red and blue subpixels are parallel to a second axis, and
- wherein the two adjacent pixel units have different subpixel arrangements.

12. The display device of claim 11, wherein the two red subpixels and two blue subpixels are alternately arranged in the direction of the first axis and are disposed in zigzags along the direction of the second axis.

13. The display device of claim 11, wherein the delta arrangement has a triangle structure obtained by connecting virtual central points of the red subpixel, the green subpixel, and the blue subpixel to one another.

14. A pixel array comprising:
- a unit pixel consisting only of a green sub-pixel, a red sub-pixel and a blue sub-pixel in a triangular configuration with a virtual center of each sub-pixel being a point of a virtual triangle that points in a particular direction indicated by the virtual center of the green sub-pixel,
- wherein each unit pixel is configured to be part of a pixel group consisting of four unit pixels adjacent tone another in a two-by-two format, which has a first set of two unit pixels adjacent to each other along an x-axis with respectively different layouts, and a second set of two unit pixels having a mirror image layout of the first set of two unit pixels about the x-axis in the pixel group, and
- wherein the green sub-pixel within the unit pixel is disposed immediately adjacent to and on a right side of the red and the blue sub-pixels of within the unit pixel, and the red and blue sub-pixel within the unit pixel are disposed immediately adjacent to and opposite a left side of the green sub-pixel within the pixel.

15. The pixel array of claim 14, wherein a plurality of pixel groups result in the pixel array, with all green sub-pixels of each column aligned lengthwise in a y-axis direction.

16. The pixel array of claim 15, wherein a plurality of pixel groups result in the pixel array, with pairs of red sub-pixels of every column aligned lengthwise in an x-axis direction, whereby odd numbered columns of the red sub-pixels are staggered with even numbered columns of the red sub-pixels.

17. The pixel array of claim 16, wherein a plurality of pixel groups result in the pixel array, with pairs of blue sub-pixels of every column aligned lengthwise in an x-axis direction or with pairs of blue sub-pixels of every other column aligned lengthwise in the y-axis direction, whereby odd numbered columns of the blue sub-pixels are staggered with even numbered columns of the blue sub-pixels.

18. The subpixel arrangement structure of claim 1, wherein plurality of unit pixels form a mirror image with respect to the second axis.

\* \* \* \* \*